US008278818B2

(12) United States Patent
Jeong et al.

(10) Patent No.: US 8,278,818 B2
(45) Date of Patent: Oct. 2, 2012

(54) ELECTROLUMINESCENT DISPLAY DEVICE AND METHOD OF FABRICATING THE SAME

(75) Inventors: Chang-Yong Jeong, Suwon-si (KR);
Tae-Wook Kang, Seongnam-si (KR);
Chang-Soo Kim, Suwon-si (KR);
Yu-Sung Cho, Jeonlanam-do (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 925 days.

(21) Appl. No.: 11/143,952

(22) Filed: Jun. 3, 2005

(65) Prior Publication Data
US 2006/0022587 A1 Feb. 2, 2006

(30) Foreign Application Priority Data

Jun. 4, 2004 (KR) .................. 10-2004-0041066
Jun. 29, 2004 (KR) .................. 10-2004-0049709

(51) Int. Cl.
*H05B 33/00* (2006.01)
(52) U.S. Cl. .................. 313/504; 313/505; 313/506
(58) Field of Classification Search .......... 313/495–512; 315/169.3, 169.4; 257/40, 79; 428/690, 428/917; 345/30, 36, 44, 45; 349/139
See application file for complete search history.

(56) References Cited

U.S. PATENT DOCUMENTS

| | | | |
|---|---|---|---|
| 2001/0005607 A1* | 6/2001 | Hasegawa et al. | 438/162 |
| 2002/0074936 A1* | 6/2002 | Yamazaki et al. | 313/504 |
| 2002/0153831 A1* | 10/2002 | Sakakura et al. | 313/504 |
| 2003/0094615 A1* | 5/2003 | Yamazaki et al. | 257/72 |
| 2003/0107326 A1* | 6/2003 | Park et al. | 315/169.3 |
| 2003/0127651 A1* | 7/2003 | Murakami et al. | 257/72 |
| 2003/0209708 A1* | 11/2003 | Kubota | 257/40 |
| 2003/0209976 A1* | 11/2003 | Abe et al. | 313/506 |
| 2003/0234608 A1* | 12/2003 | Lee et al. | 313/504 |
| 2004/0079937 A1* | 4/2004 | Miyazawa | 257/10 |
| 2004/0085014 A1* | 5/2004 | Park et al. | 313/504 |

(Continued)

FOREIGN PATENT DOCUMENTS

CN 1443025 9/2003

(Continued)

OTHER PUBLICATIONS

Chinese Office Action dated Jul. 17, 2009.

*Primary Examiner* — Anh Mai
*Assistant Examiner* — Elmito Breval
(74) *Attorney, Agent, or Firm* — H.C. Park & Associates, PLC

(57) ABSTRACT

An electroluminescent (EL) display device and a method of fabricating the same are provided. The device includes a substrate; a plurality of pixel electrodes disposed on the substrate; a pixel defining layer disposed on the pixel electrodes and having an opening part exposing a predetermined part of each of the pixel electrodes; and at least one barrier layer comprised in and/or on the pixel defining layer. In this device, the pixel defining layer includes at least one barrier layer in order to reduce the amount of outgas from the pixel defining layer and prevent degradation of an emission portion due to the outgas. Also, the pixel defining layer is formed to a sufficiently small thickness to facilitate a subsequent process using a laser induced thermal imaging (LITI) process.

16 Claims, 21 Drawing Sheets

U.S. PATENT DOCUMENTS

| | | | |
|---|---|---|---|
| 2004/0217697 A1* | 11/2004 | Lee et al. | 313/504 |
| 2004/0239241 A1* | 12/2004 | Wittmann et al. | 313/511 |
| 2004/0245923 A1* | 12/2004 | Park et al. | 313/505 |
| 2005/0116631 A1* | 6/2005 | Kim et al. | 313/506 |

FOREIGN PATENT DOCUMENTS

| | | | |
|---|---|---|---|
| JP | 2002-203682 | | 7/2002 |
| JP | 2003-168569 | | 6/2003 |
| JP | 2003-282241 | | 10/2003 |
| JP | 2003-297554 | | 10/2003 |
| JP | 2003-332058 | | 11/2003 |
| JP | 2003332058 A | * | 11/2003 |
| JP | 2004-004524 | | 1/2004 |
| JP | 2004-087531 | | 3/2004 |
| JP | 2004-119138 | | 4/2004 |
| JP | 2005-078946 | | 3/2005 |
| JP | 2005-150105 | | 6/2005 |
| KR | 1020010112623 | | 12/2001 |
| KR | 1020030074186 | | 9/2003 |
| KR | 1020030088872 | | 11/2003 |
| KR | 1020030094003 | | 12/2003 |
| KR | 1020050115705 | | 12/2005 |

\* cited by examiner

ELECTROLUMINESCENT DISPLAY DEVICE AND METHOD OF FABRICATING THE SAME

CROSS-REFERENCE TO RELATED APPLICATION

This application claims the benefit of Korean Patent Application Nos. 10-2004-0041066, filed on Jun. 4, 2004, and 10-2004-0049709, filed on Jun. 29, 2004, which are hereby incorporated by reference for all purposes as if fully set forth herein.

BACKGROUND OF THE INVENTION

1. Field of the Invention

The present invention relates to an electroluminescent (EL) display device and a method of fabricating the same and, more particularly, to an EL display device, which includes a pixel defining layer with at least one barrier layer to reduce the amount of outgas from the pixel defining layer and prevent the degradation of an emission portion due to the outgas, and a method of fabricating the same.

2. Description of the Related Art

Thin and lightweight portable display devices that quickly process a great deal of information are being rapidly developed as the demand for prompt and accurate information increases. Conventional cathode ray tubes (CRT) are heavy, take up a lot of space, and consume a lot of power, and a liquid crystal display (LCD) is complex to manufacture, it has a narrow viewing angle, and it has technical limits in contrast ratio and scaling-up.

On the other hand, an organic EL display device is a self-emissive device in which electrons and holes recombine in an organic emitting layer to generate light. Therefore, not only may the organic EL display device be made lightweight and thin, it may be made with a simpler process since a separate light source is not required unlike an LCD. Furthermore, the organic EL display device has as fast a response speed as a CRT and consumes less power than the CRT. Consequently, the organic EL display device is being considered as a primary next-generation display.

FIG. 1 is a plan view showing a pixel consisting of red (R), green (G) and blue (B) unit pixels of a conventional electro luminescent display device.

Referring to FIG. 1, scan lines 1 may be arranged in a row direction, data lines 2 may be arranged in a column direction and insulated from the scan lines 1, and common power supply voltage lines 3 may be arranged in the column direction, insulated from the scan lines 1 and parallel to the data lines 2. Accordingly, the scan lines 1, the data lines 2 and the common power supply voltage lines 3 define a plurality of unit pixels, such as, for example, R, G, B unit pixels.

Each unit pixel may comprise a switching thin film transistor (TFT) 5, a driving TFT 6, a capacitor 7, and an organic light emitting diode 9.

In each unit pixel, data signals from the data lines 2 according to scan signals from the scan lines 1, for example, electric charges according to a difference between a data voltage and a voltage from the common power supply voltage lines 3, accumulate in the capacitor 7, and signals by the electric charges accumulated in the capacitor 7 are input into the driving TFT 6 through the switching TFT 5. Subsequently, the driving TFT 6 receives the data signals and sends electrical signals to a pixel electrode 8, so that the organic light emitting diode 9, which comprises an organic emission layer formed between the pixel electrode 8 and an opposing electrode, emits light.

FIG. 2 is a cross-sectional view showing an organic light emitting diode in an organic EL display device taken along line I-I' of FIG. 1.

Referring to FIG. 2, a substrate having R, G, and B unit pixels is provided.

A pixel electrode 8 may be formed on the substrate 10. Then, a pixel defining layer 12 is formed on the entire surface of the substrate 10 having the pixel electrode 8 to define a pixel region where an emission layer will be formed.

Here, the pixel defining layer 12 is generally formed of a photosensitive material. An opening part 11 exposing a part of the pixel electrode 8 may be formed by a photolithography process on the pixel defining layer 12.

After forming the opening part 11, the pixel defining layer 12 may be hardened at temperature of about 230° C. to 280° C. by baking to remove outgas remaining in the pixel defining layer 12.

An organic layer 13 including at least an organic emission layer may be formed on the surface of the substrate 10 having the opening part 11, and an opposing electrode 14 may then be formed on the organic layer 13 and sealed, thereby completing fabrication of the organic EL display device.

In addition to the organic emission layer, the organic layer 13 may further include at least one of a hole injection layer, a hole transport layer, a hole blocking layer, an electron transport layer, and an electron injection layer However, the outgas cannot be completely removed even though the pixel defining layer 12 is hardened. Furthermore, short-term or long-term chemical decomposition may continuously generate outgas in the pixel defining layer 12.

The outgas may cause pixels to shrink, and it may lower the life cycle of an organic EL display device by deteriorating the organic emission layer. Furthermore, at high temperatures, a material in the pixel defining layer 12 can be decomposed into various molecules including functional groups. The functional groups may change the chemical structure of the organic emission layer, thereby negatively affecting the light emitting function of the organic emission layer, which may deteriorate the device's luminance and color purity.

While an inorganic layer may be used as the pixel defining layer 12 in order to solve the foregoing problems, the inorganic layer may complicate the fabrication process.

SUMMARY OF THE INVENTION

The present invention, therefore, solves aforementioned problems associated with conventional devices and methods by providing an EL display device and a method of fabricating the same, in which a pixel define layer comprises at least one barrier layer to reduce the amount of outgas from the pixel defining layer and prevent the degradation of an organic layer due to the outgas.

In an exemplary embodiment of the present invention, an EL display device includes: a substrate; a plurality of pixel electrodes disposed on the substrate; a pixel defining is layer disposed on the pixel electrodes and having an opening part exposing a predetermined part of each of the pixel electrodes; and at least one barrier layer disposed in and/or on the pixel defining layer.

In another exemplary embodiment of the present invention, an EL display device includes: a substrate; a plurality of pixel electrodes disposed on the substrate; a plurality of pixel defining layers disposed on the pixel electrodes and having an opening part exposing a predetermined part of each of the pixel electrodes; and at least one barrier layer disposed in and/or on each of the pixel defining layers.

In another exemplary embodiment of the present invention, a method of fabricating an EL display device includes: forming a pixel electrode on a substrate; forming a pixel defining layer on the entire surface of the substrate having the pixel electrode, the pixel defining layer having an opening part exposing a predetermined part of the pixel electrode; forming a barrier layer by injection impurities into onto the pixel defining layer; forming an emission layer on the exposed part of the pixel electrode; and forming an opposing electrode on the organic layer.

In another exemplary embodiment of the present invention, a method of fabricating an EL display device includes: forming a pixel electrode on a substrate; forming a pixel defining layer on the entire surface of the substrate having the pixel electrode, the pixel defining layer having an opening part exposing a predetermined part of the pixel electrode; forming a barrier layer by heat curing a part of the pixel defining layer; forming an emission layer on the exposed part of the pixel electrode; and forming an opposing electrode on the organic layer.

BRIEF DESCRIPTION OF THE DRAWINGS

The above and other features of the present invention will be described in reference to certain exemplary embodiments thereof with reference to the attached drawings in which.

DETAILED DESCRIPTION

The present invention will now be described more fully hereinafter with reference to the accompanying drawings, in which exemplary embodiments of the invention are shown.

Figure 1:
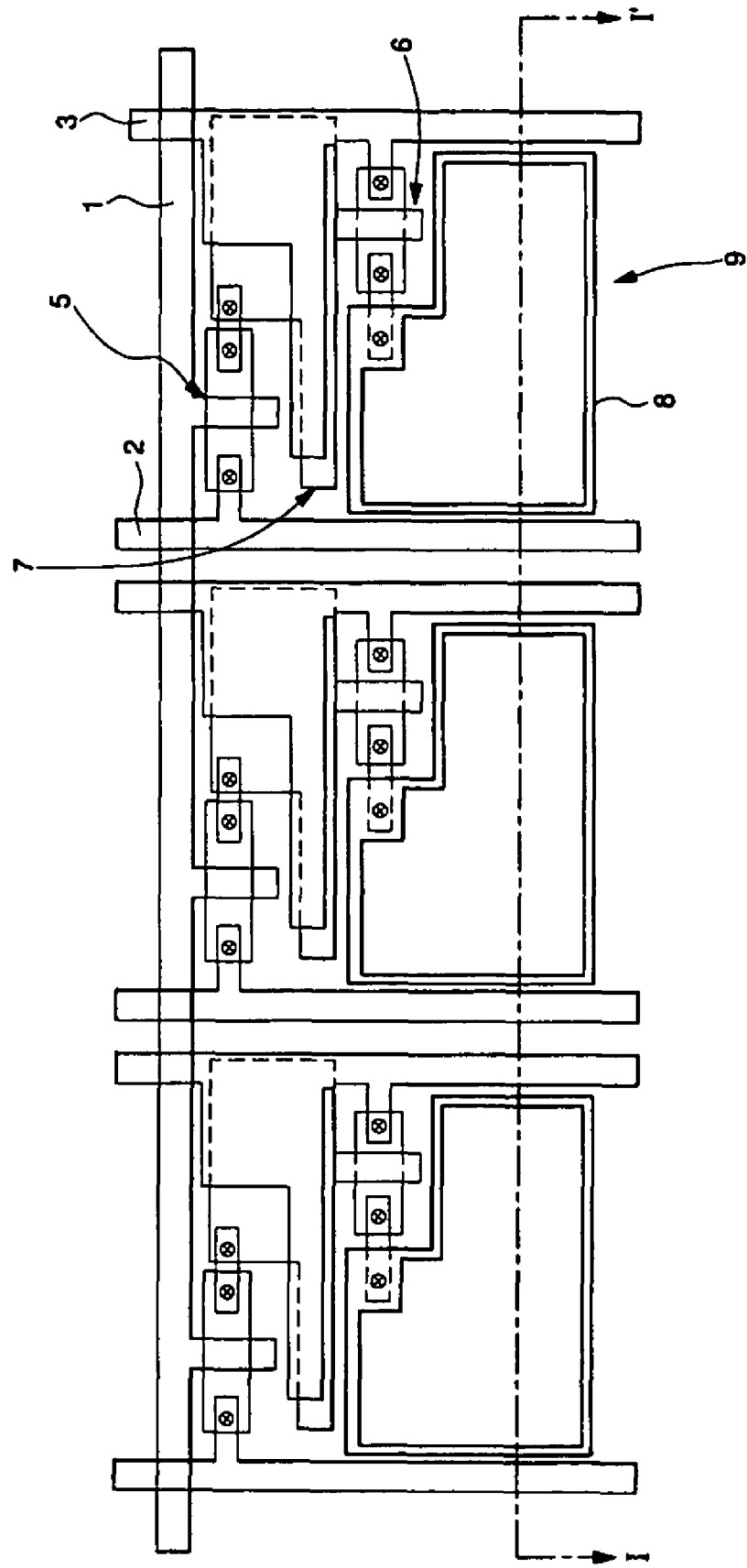
FIG. 1 is a plan view showing a pixel consisting of red (R), green (G) and blue (B) unit pixels of a conventional EL display device.
Figure 2:
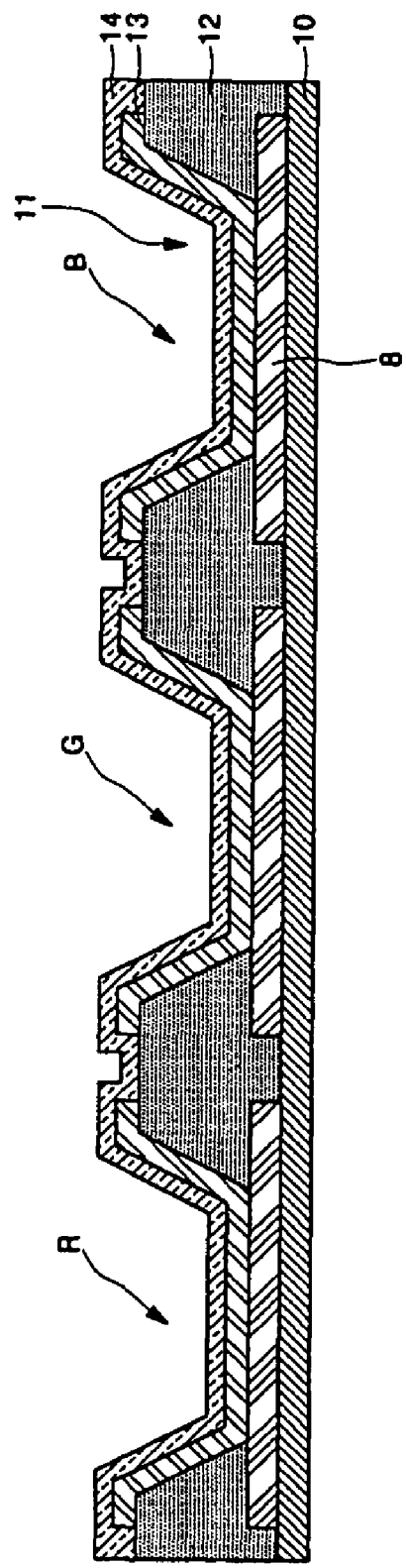
FIG. 2 is a cross-sectional view taken along line I-I' of FIG. 1.
Figure 3A:
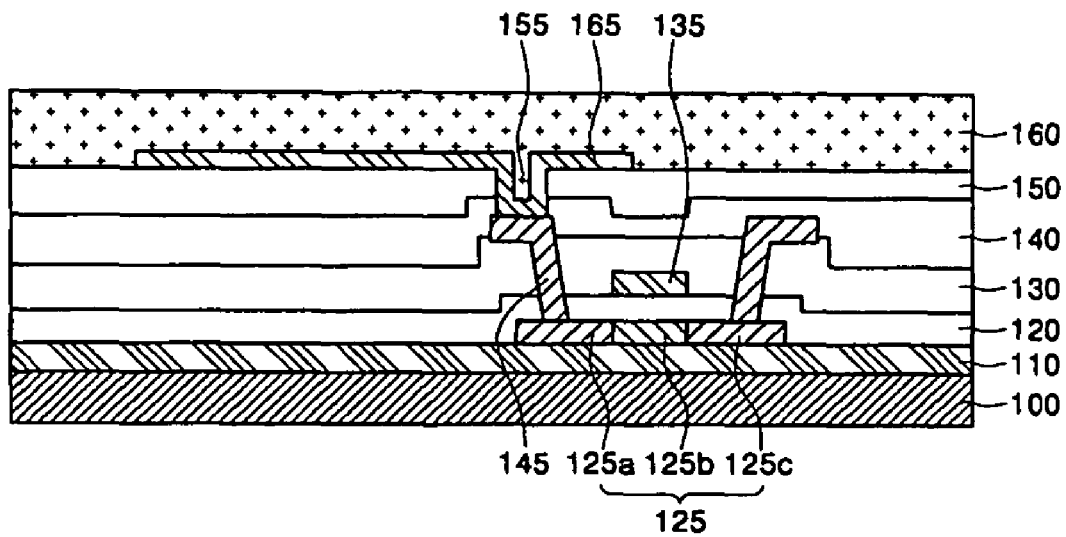
FIGS. 3A through 3C are cross-sectional views of an EL display device according to an exemplary embodiment of the present invention.
Figure 3B:
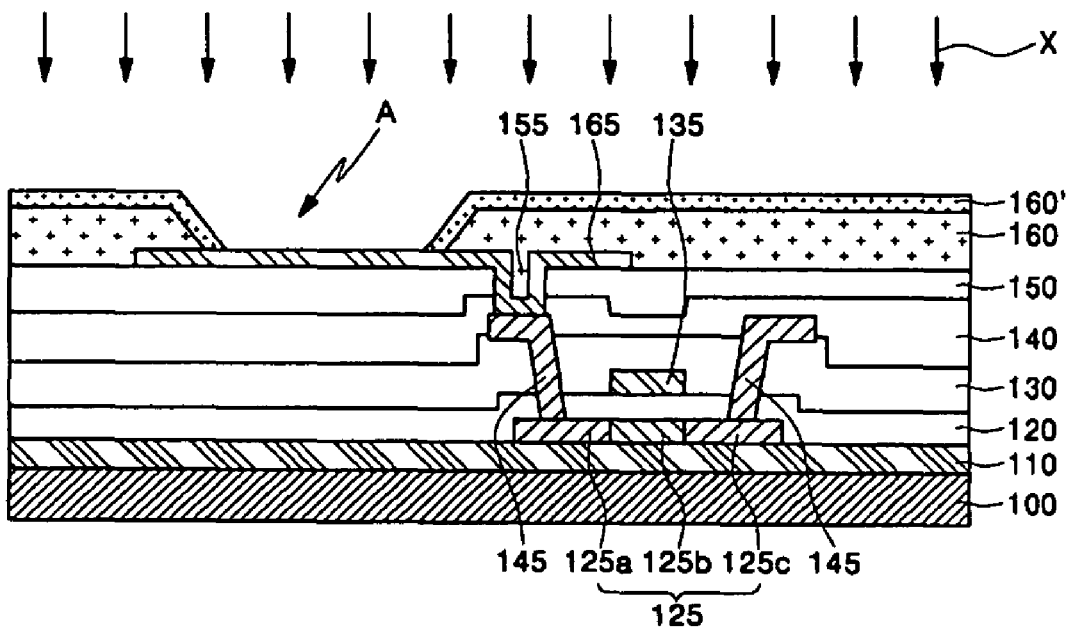
Figure 3C:
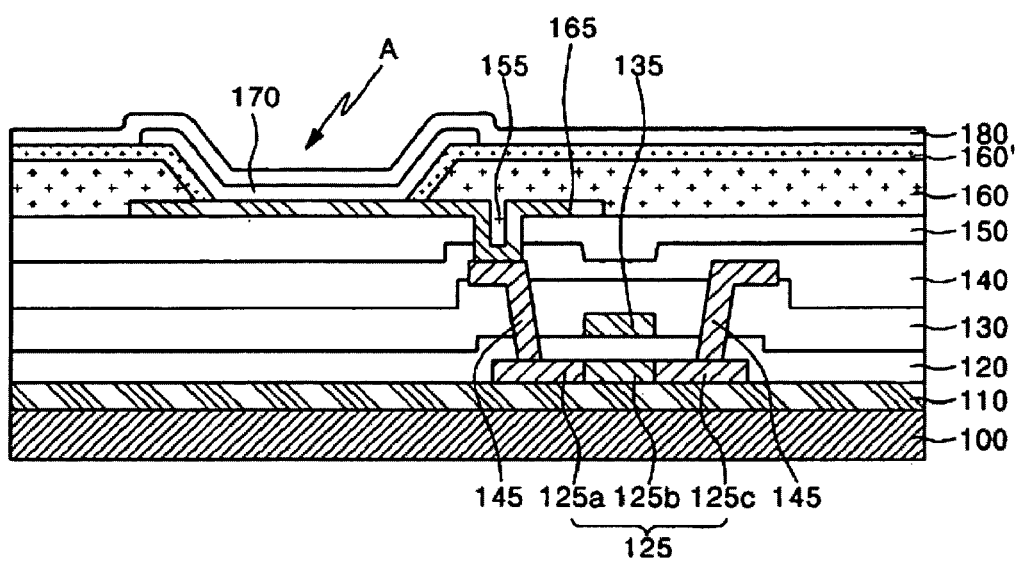

FIG. 3A through FIG. 3C are cross-sectional views for explaining an EL display device and method for fabricating the same according to an exemplary embodiment of the present invention.

Referring to FIG. 3A, a substrate 100 is provided. A buffer layer 110, which may be, for example, a silicon oxide layer, a silicon nitride layer or a laminated layer of the silicon oxide layer and the silicon nitride layer, may be formed on the substrate 100 to block impurities from flowing out of an upper part of the substrate 100.

After forming the buffer layer 110, a polysilicon layer 125 may be formed by crystallizing amorphous silicon on the buffer layer 110.

A gate insulation layer 120 may then be formed on the substrate 100 having the polysilicon layer 125, and a gate electrode 135 may be formed on the gate insulation layer 120 at a region corresponding to a channel region 125$b$ of the polysilicon layer 125.

Then, the polysilicon layer 125 may be doped with ions to form a semiconductor layer 125 including a drain region 125$a$, a source region 125$c$ and the channel region 125$b$.

An interlayer insulation layer 130 may then be formed on the gate insulation layer 120 and the gate electrode 135, and contact holes for exposing parts of the drain region 125$a$ and the source region 125$c$ are etched in the gate insulation layer 120 and the interlayer insulation layer 130.

Next, source and drain electrodes 145 may be formed on the interlayer insulation layer 130. The source and drain electrodes 145 are connected to the source and drain regions 125$c$ and 125$a$, respectively, through the contact holes.

After forming the source and drain electrodes 145, a passivation insulation layer 140 may be formed on the interlayer insulation layer 130 and the source and drain electrodes 145. The passivation insulation layer 140 can be, for example, an $SiO_2$, $SiN_x$ or $SiO_2/SiN_x$ laminated layer.

Furthermore, a planarization layer 150 may be formed on the passivation insulation layer 140 to flatten a bump generated due to the underlying TFT.

The planarization layer 150 can be formed of, for example, polyamide resin, polyimide resin, acryl resin, and silicon based resin.

After forming the planarization layer 150, a via hole 155 may be formed by etching the planarization layer 150 and the passivation layer 140 to expose one of the source and drain electrodes 145. FIG. 3A shows the via hole 155 exposing a part of the drain electrode 145.

Next, a pixel electrode 165 may be formed so that it is coupled to the source or drain electrode 145 that is exposed by the via hole 155.

If the pixel electrode 165 acts as an anode, the pixel electrode 165 may be a transparent electrode formed of, for example, indium tin oxide (ITO) or indium zinc oxide (IZO), or it may be formed as a reflection electrode using Pt, Au, Ir, Cr, Mg, Ag, Ni, Al or an alloy thereof as a metal having a high work function.

Furthermore, if the pixel electrode 165 acts as the cathode, the pixel electrode 165 may be formed as a thin transparent electrode or a thick reflection electrode formed of Mg, Ca, Al, Ag, Ba or alloy thereof as a metal having a low work function.

A pixel defining layer 160 may then be formed by a spin coating or dip coating process on the substrate 100 having the pixel electrode 165.

Additionally, the pixel defining layer 160 may be formed about 1000 to about 5000 Å thick considering the thickness of an organic layer that will be formed later using a laser induced thermal imaging (LITI) process.

The pixel defining layer 160 may be formed of, for example, one material selected from the group consisting of polystyrene, polymethylmethacrylate, polyacrylonitrile, polyamide, polyimide, polyarylether, heterocyclic polymer, parylene, fluorine polymer, epoxy resin, benzocyclobutene based resin, siloxane based resin, and silane resin.

After forming the pixel defining layer 160, as shown in FIG. 3B, an opening part A for exposing a part of the pixel electrode 165 may be formed by patterning the pixel defining layer 160 through an ordinary photolithography process.

The pixel defining layer 160 passes through a bake process at a temperature of about 230° C. to 260° C. to remove outgas remaining in the pixel defining layer 160. However, the baking process may not completely remove all outgas, thereby adversely affecting the light emitting function of an organic EL display device.

Therefore, a barrier layer 160' may be formed on the pixel defining layer 160 pattern to prevent outgas generated from the pixel defining layer 160 from permeating an organic emission layer.

The barrier layer 160' may be formed by curing an upper part of the existing pixel defining layer 160 pattern by injecting impurities X onto the pixel defining layer 160.

The impurities X can be, for example, ions or inert gas.

The ions can be ions of one element selected from the group consisting of B, P and As. The ions may be injected onto the pixel defining layer 160 to a dose amount of about $10^{14}$ to $10^{15}$ ions/cm$^2$ at an acceleration energy of about 75 to about 85 keV using an ion injector, such as, for example, an ion shower or implantation process.

On the other hand, the inert gas can be a gas selected from the group consisting of Ar, He, Xe, $H_2$, and Ne. The inert gas may be accelerated onto the pixel defining layer 160 at a flow rate of at least 50 sccm (standard cubic centimeters per minute) at an electric power of about 100 W in a vacuum of about 10 to 400 mtorr using sputtering equipment, such as, for example, an etcher or asher.

The thicker the barrier layer 160' is formed, the more it is capable of preventing outgas from permeating into an organic emission layer. However, although the barrier layer may be formed thick using high energy or increasing the concentration of impurities, this may increase production cost, since expensive equipment may be required, or increase fabrication time, thereby lowering productivity.

Therefore, the thickness of the barrier layer 160' may be about 10% or less of the thickness of the pixel defining layer 160.

Also, the barrier layer 160' may be formed on the pixel defining layer 160, is naturally formed by heat curing the pixel defining layer 160. In this case, the pixel defining layer 160 may be heat cured by performing an annealing process in a vacuum oven or furnace. The barrier layer 160' on the pixel defining layer may be formed by heat curing the pixel defining layer until the pixel defining layer shrinks to about 50% of an original thickness of the pixel defining layer.

Subsequently, as shown in FIG. 3C, an emission layer 170 having at least an emission layer may be formed on the pixel electrode 165 and the pixel defining layer 160.

In an organic EL display device, the emission layer 170 may be formed of a small molecule organic layer or polymer organic layer.

When the emission layer 170 is a small molecule organic layer, the organic layer 170 may include one or more of layers such as a hole injection layer (HIL), hole transport layer (HTL), emission layer (EML), electron transport layer (ETL), and electron injection layer (EIL). The emission layer 170 may be formed of various organic materials, such as, for example, copper phthalocyanine (CuPc), N,N'-Di(naphthalene-1-yl)-N,N'-diphenyl-benzidine (NPB), or tris-8-hydroxyquinoline aluminum (Alq3). When electric charges are supplied to the pixel electrode 165 and an opposing electrode, holes and electrons recombine to generate excitons. As the excitons are changed from an excited state to a ground state, the emission layer (EML) emits light.

Of course, the structure of the small molecule organic layer is not limited to the above description, but the emission layer 170 can include various layers according to purposes.

When the emission layer 170 is a polymer organic layer, the organic layer 170 may generally include a polymer HTL and a polymer EML. The polymer HTL may be formed of poly-(2,4)-ethylene-dihydroxy thiophene (PEDOT) or polyaniline (PANI) using an inkjet printing or spin coating process. The polymer EML may be formed of PPV, soluble PPV's, Cyano-PPV, or polyfluorene. Of course, the structure of the polymer organic layer is not limited to the above description, but the emission layer 170 can include various layers according to purposes.

Also, the EML may be formed as a color pattern by an ordinary method, such as, for example, an depositing, an inkjet printing or spin coating process or LITI process.

In the case of an inorganic light emitting display device, the emission layer may be formed of an inorganic layer instead of the above-described organic layer, and the inorganic layer may include an emission layer and an insulation layer interposed between the emission layer and an electrode. Of course, the structure of the inorganic layer is not limited to the above description, but the inorganic layer may include various layers according to purposes. In the inorganic light emitting display device, the emission layer may be formed of a metal sulfide, such as ZnS, SrS, or CaS, or an alkaline earths kalium sulfide, such as $CaGa_2S_4$ or $SrGa_2S_4$, and emission-atoms of a transitional metal or alkaline rare-earth metal including Mn, Ce, Tb, Eu, Tm, Er, Pr, and Pb.

An opposing electrode 180 may then be formed on the emission layer 170.

If the opposing electrode 180 acts as a cathode, the opposing electrode 180 may be formed as a thin transparent electrode or a thick reflection electrode formed of Li, LiF/Ca, LiF/Al, Mg, Ca, Al, Ag or an alloy thereof as a conductive metal having a low work function.

Furthermore, if the opposing electrode 180 acts as an anode, the opposing electrode 180 can be a transparent electrode formed of ITO or IZO, or a reflection electrode formed of Pt, Au, Ir, Cr, Mg, Ag, Ni, Al or an alloy thereof as a metal having a high work function.

Although not shown in the drawings, an EL display device can be fabricated by sealing the opposing electrode 180 using a sealant, such as an upper metal can.

Figure 4:
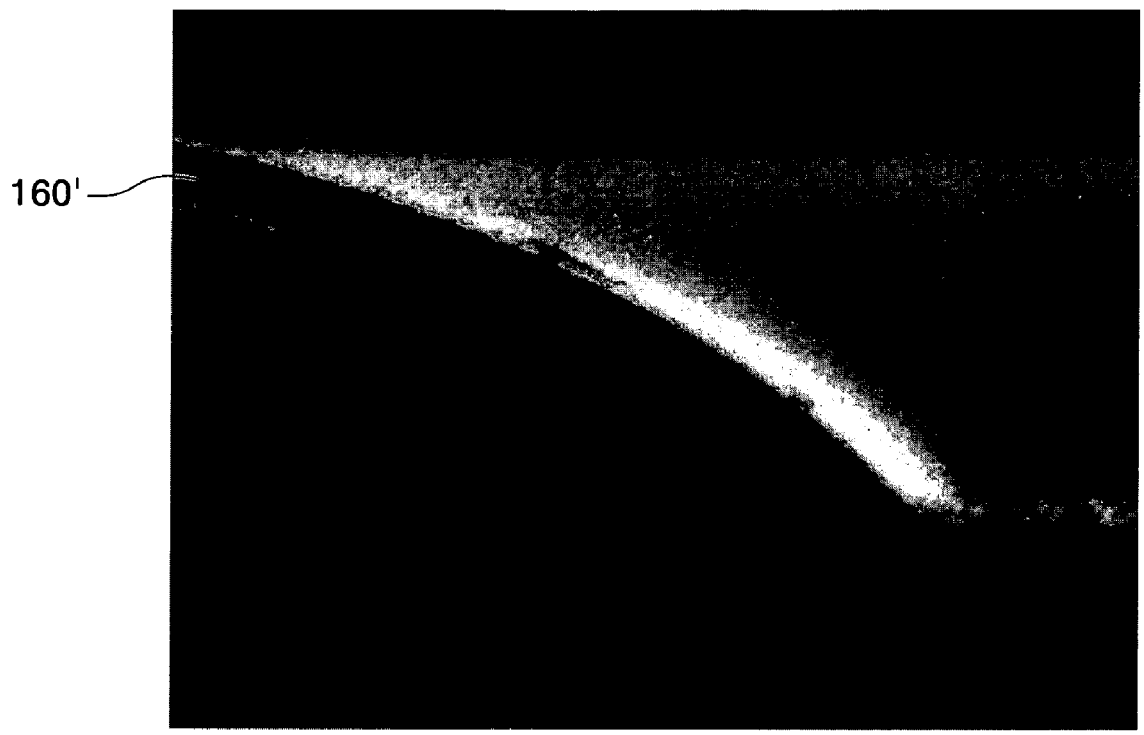
FIG. 4 is a photograph of a barrier layer obtained after injecting impurities onto an upper part of a pixel defining layer.

FIG. 4 is a photograph of a barrier layer obtained after impurities are doped on an upper part of a pixel defining layer.

As shown in FIG. 4, about a 2,800 Å thick barrier layer 160' may be formed by injecting P ions onto the pixel defining layer at a dose amount of about $10^{15}$ ions/cm$^2$ at an acceleration energy of about 75 keV.

As described above, an EL display device with the barrier layer may be formed by doping impurities on the pixel defining layer without adding a separate mask process according to the present invention.

An EL display device according to the present invention may minimize thermal strain stress of a pixel defining layer due to the external environment by forming the barrier layer and prevent degradation of the organic emission layer and contraction of pixels by preventing outgas from permeating into the organic emission layer.

According to the present invention, the barrier layer 160' is formed in the pixel defining layer 160 to prevent generation of outgas. Thus, the area of a region where outgas may be generated is comparatively reduced in the pixel defining layer 160, thereby ultimately decreasing the amount of outgas. Also, since the pixel defining layer 160 includes the barrier layer 160', it is possible to prevent outgas generated in the pixel defining layer 160 from being discharged and adversely affecting an EL display device. In particular, the outgas generated in the pixel defining layer 160 should go round the barrier layer 160' in order that it may be discharged out of the pixel defining layer 160. That is, the present invention makes a discharge path of the outgas longer, thus suppressing the discharge of the outgas.

Furthermore, in the above-described structure, since the barrier layer 160' is disposed on the surface of the pixel defining layer 160, the outgas generated in the pixel defining layer 160 is not discharged out of the pixel defining layer 160.

Figure 5:
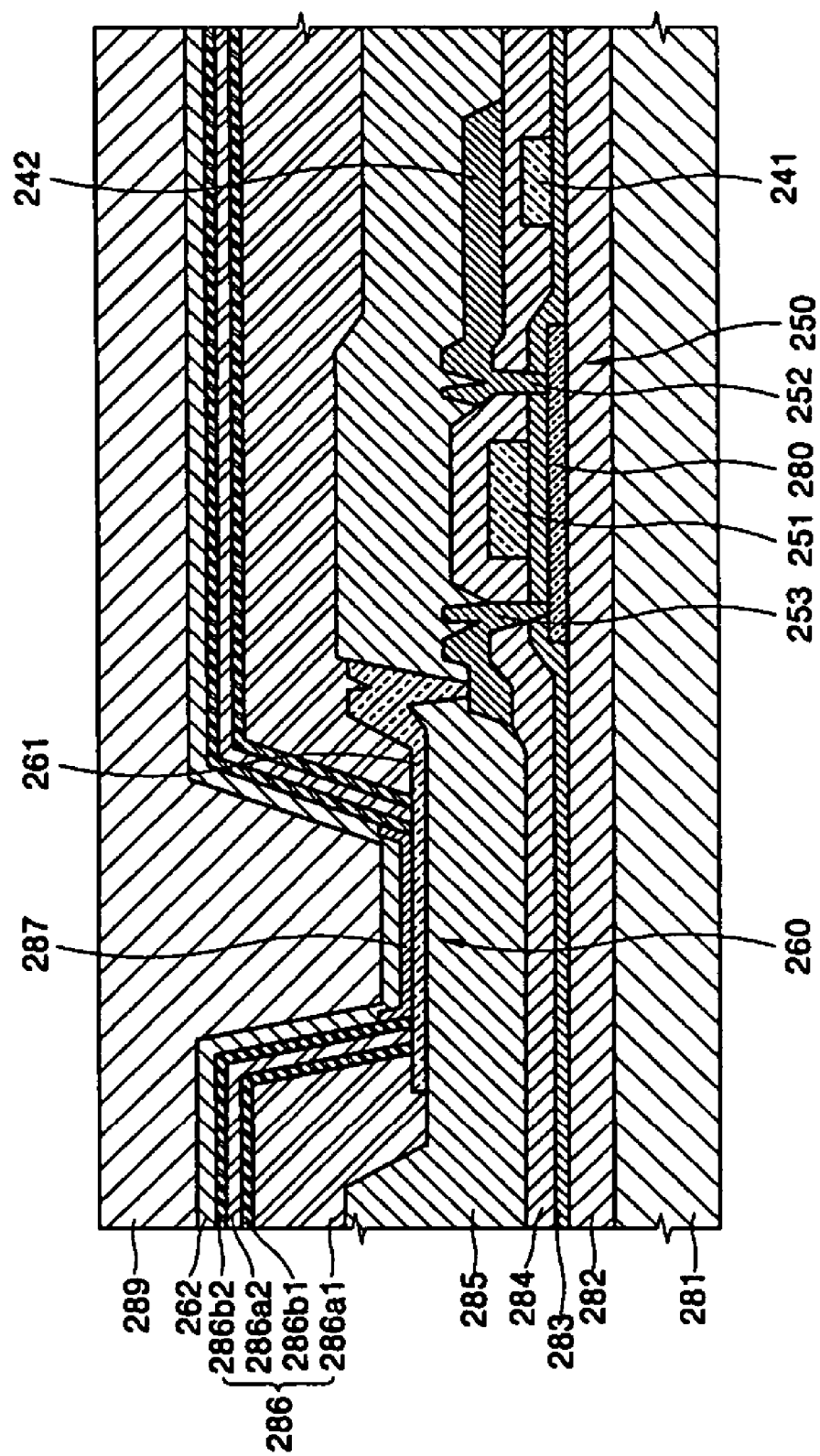
FIG. 5 is a cross-sectional view of an EL display device according to another exemplary embodiment of the present invention.

FIG. 5 is a cross-sectional view of an EL display device according to another exemplary embodiment of the present invention.

Referring to FIG. 5, pixel defining layers 286a1 and 286a2 are disposed between display portions 260, more specifically, between pixel electrodes 261. The present embodiment differs from the first embodiment in that each of the pixel defining layers 286a1 and 286a2 comprises a barrier layer 286b1 and 286b2, respectively.

In the present embodiment, the double barrier layer 286b1 and 286b2 are disposed in the pixel defining layer 286 to prevent generation of outgas.

Thus, the area of a region where outgas may be generated is comparatively reduced in the pixel defining layer 286, thereby ultimately decreasing the amount of outgas. Also, since the pixel defining layer 286 includes the double barrier layer 286b1 and 286b2, it is possible to prevent outgas generated in the pixel defining layer 286 from being discharged and adversely affecting an EL display device. In particular, the outgas generated in the pixel defining layer 286 should go round the double barrier layer 286b1 and 286b2 in order that it may be discharged out of the pixel defining layer 286. That is, the present invention makes a discharge path of the outgas longer, thus suppressing the discharge of the outgas.

Unlike in FIG. 5, the pixel defining layer 286 may comprise three or more barrier layers in the pixel defining layer.

Figure 6:
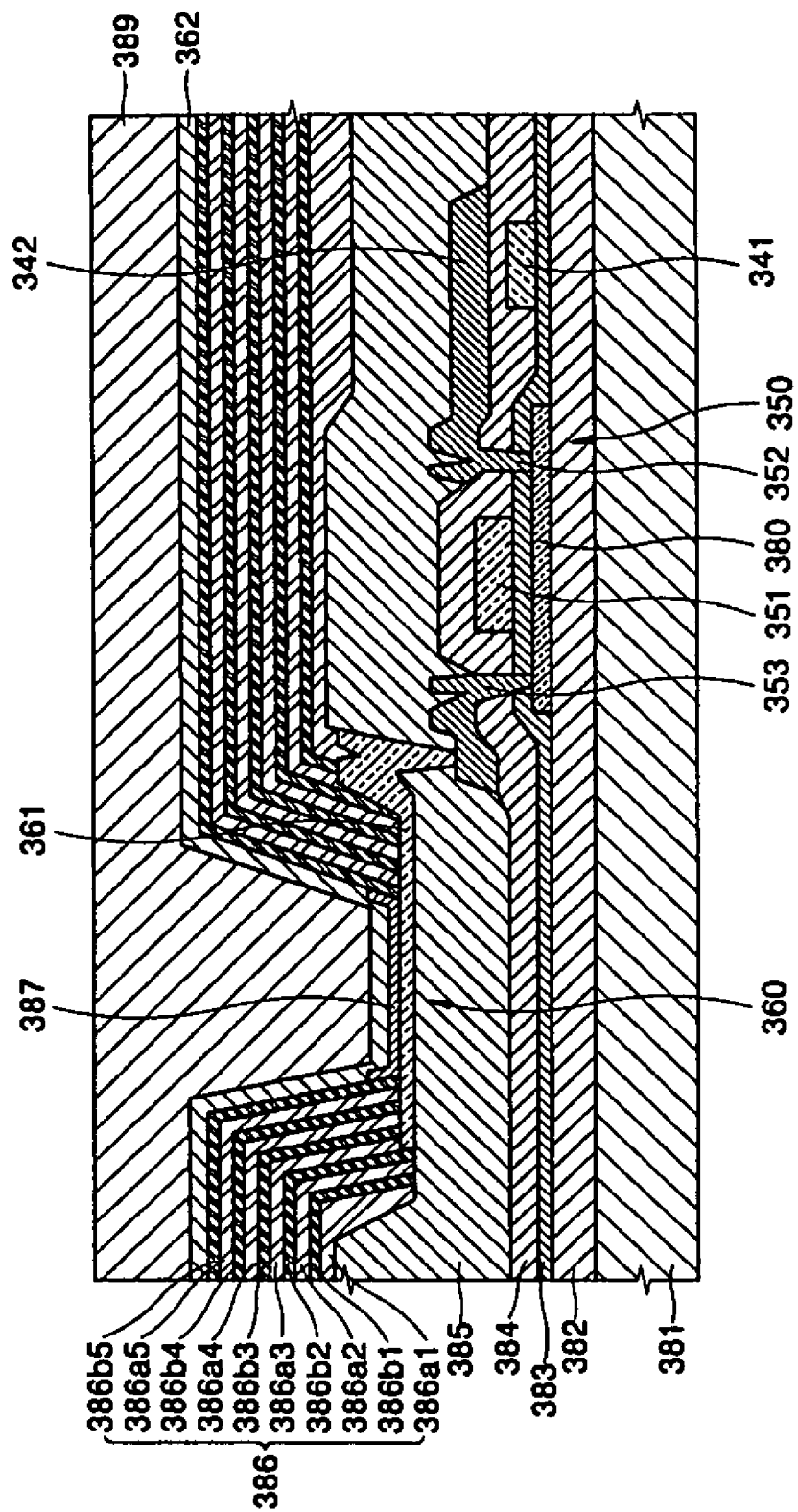
FIG. 6 is a cross-sectional view of an EL display device according to still another exemplary embodiment of the present invention.

FIG. 6 is a cross-sectional view of an EL display device according to still another exemplary embodiment of the present invention.

Referring to FIG. 6, pixel defining layers 386a1, 386a2, 386a3, 386a4, and 386a5 are disposed between display portions 360, more specifically, between pixel electrodes 361. The present embodiment differs from the first and second embodiments in that each of the pixel defining layers 386a1, 386a2, 386a3, 386a4, and 386a5 includes barrier layers 386b1, 386b2, 386b3, 386b4, and 386b5, respectively. In particular, as shown in FIG. 6, the barrier layers 386b1, 386b2, 386b3, 386b4, and 386b5 are disposed parallel to each other so that they form an on ion shape.

In the present embodiment, a plurality of barrier layers 386b1, 386b2, 386b3, 386b4, and 386b5 are disposed in the pixel defining layer 386 to prevent generation of outgas. Thus, the area of a region where outgas may be generated is comparatively reduced in the pixel defining layer 386, thereby ultimately decreasing the amount of outgas.

Also, since the pixel defining layer 386 includes the barrier layers 386b1, 386b2, 386b3, 386b4, and 386b5, it is possible to prevent outgas generated in the pixel defining layer 386 from being discharged and adversely affecting an EL display device. In particular, the outgas generated in the pixel defining layer 386 should go round the multiple barrier layer 386b1, 386b2, 386b3, 386b4, and 386b5 in order that it may be discharged out of the pixel defining layer 386. That is, the present invention makes a discharge path of the outgas longer, thus suppressing the discharge of the outgas.

Figure 7:
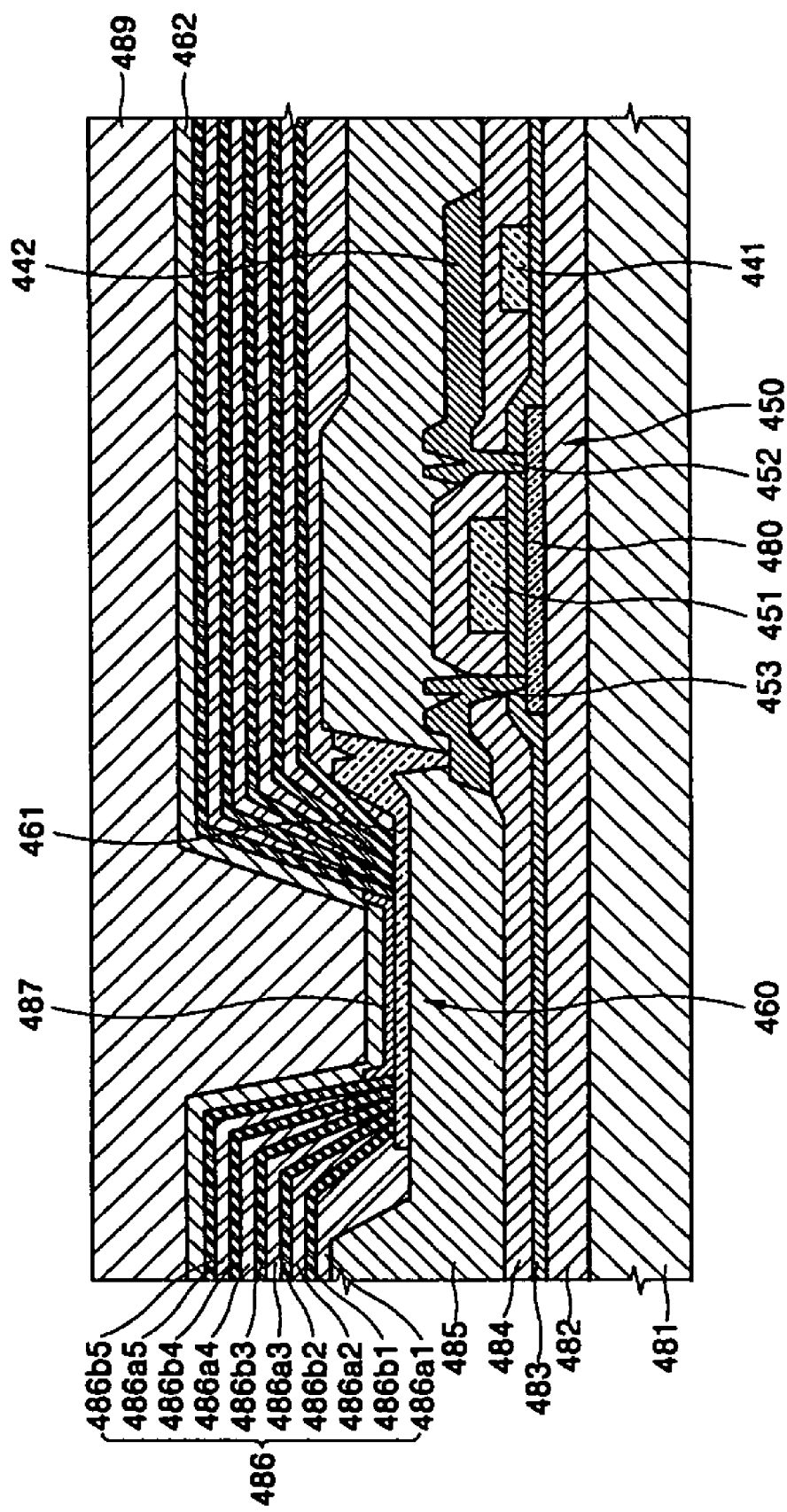
FIG. 7 is a cross-sectional view of an EL display device according to yet another exemplary embodiment of the present invention.

FIG. 7 is a cross-sectional view of an EL display device according to yet another exemplary embodiment of the present invention.

Referring to FIG. 7, pixel defining layers 486a1, 486a2, 486a3, 486a4, and 486a5 are disposed between display portions 460, more specifically, between pixel electrodes 461. The present embodiment differs from the first, second, and third embodiments in that edge portions of the barrier layers 486b1, 486b2, 486b3, 486b4, and 486b5 are adjacent to one another.

In the present embodiment, a plurality of barrier layers 486b1, 486b2, 486b3, 486b4, and 486b5 are comprised in the pixel defining layer 486 to prevent generation of outgas. Thus, the area of a region where outgas may be generated is comparatively reduced in the pixel defining layer 486, thereby ultimately decreasing the amount of outgas.

Also, since the barrier layers 486b1, 486b2, 486b3, 486b4, and 486b5, it is possible to prevent outgas generated in the pixel defining layer 486 from being discharged and adversely affecting an EL display device. In particular, the outgas generated in the pixel defining layer 486 should go round the multiple barrier layer 486b1, 486b2, 486b3, 486b4, and 486b5 in order that it may be discharged out of the pixel defining layer 486. That is, the present invention makes a discharge path of the outgas longer, thus suppressing the discharge of the outgas.

On the other hand, since the edge portions of the barrier layers 486b1, 486b2, 486b3, 486b4, and 486b5 are adjacent to one another as described above, a part of the pixel defining layer 486, which is adjacent to the display portion 460, is comprised of only the barrier layers 486b1, 486b2, 486b3, 486b4, and 486b5. Thus, even if outgas is generated in the pixel defining layer 486, it is possible to prevent the outgas from negatively affecting the display portion 460.

Figure 8:
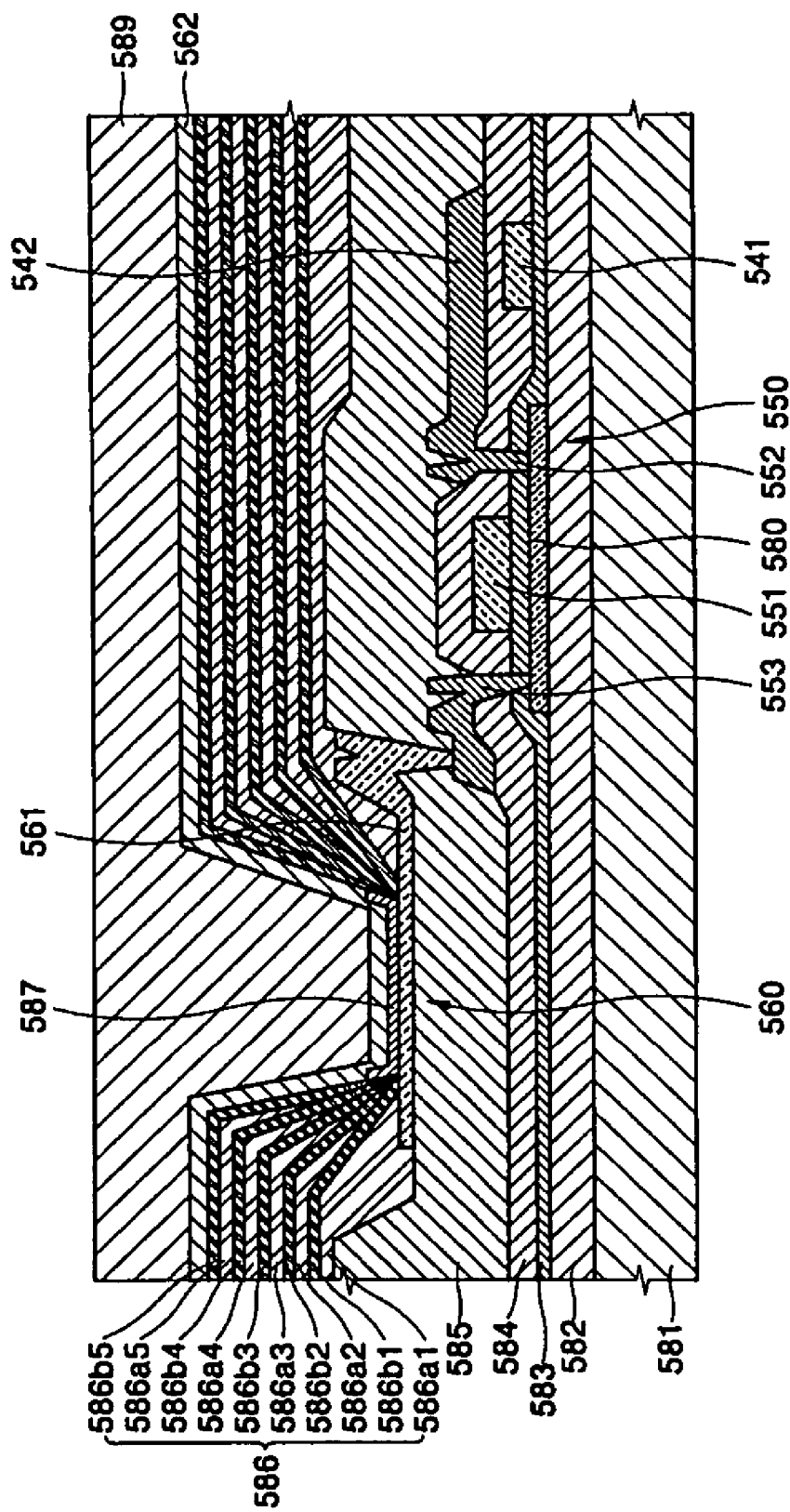
FIG. 8 is a cross-sectional view of an EL display device according to further another exemplary embodiment of the present invention.

FIG. 8 is a cross-sectional view of an EL display device according to further another exemplary embodiment of the present invention.

Referring to FIG. 8, pixel defining layers 586a1, 586a2, 586a3, 586a4, and 586a5 are disposed between display portions 560, more specifically, between pixel electrodes 561. The present invention differs from the above-described embodiments in that barrier layers 586b1, 586b2, 586b3, 586b4, and 586b5 are formed on the pixel defining layers 586a1, 586a2, 586a3, 586a4, and 586a5, respectively. In particular, as shown in FIG. 8, edge portions of the barrier layers 586b1, 586b2, 586b3, 586b4, and 586b5 are adjacent to one another.

The main difference between the present embodiment and the fourth embodiment as described with reference to FIG. 7 is the shape of edge portions of barrier layers included in a pixel defining layer. In the EL display device of the fourth embodiment, the part of the pixel defining layer, which is adjacent to the display portion, is comprised of only barrier layers. However, because the edge portions of the barrier layers are adjacent to one another, the total thickness of parts of barrier layers, which are adjacent to the display portion, becomes great, so that the display portion may be narrow.

In comparison, in the EL display device of the present embodiment, the edge portions of the barrier layers 586b1, 586b2, 586b3, 586b4, and 586b5 overlap one another. Thus, since a part of the pixel defining layer 586, which is adjacent to the display portion 560, is comprised of only the barrier layers 586*b*1, 586*b*2, 586*b*3, 586*b*4, and 586*b*5, even if outgas is generated in the pixel defining layer 586, it is possible to prevent the outgas from negatively affecting the display portion 50. Furthermore, the total thickness of parts of the barrier layers 586*b*1, 586*b*2, 586*b*3, 586*b*4, and 586*b*5, which are adjacent to the display portion 560, can be held constant, so that the display portion 560 is not narrowed.

On the other hand, in the foregoing embodiments, it is important to appropriately control the thickness of a pixel defining layer. Hereinafter, a method for controlling the thickness of the pixel defining layer will be described.

Figure 9:
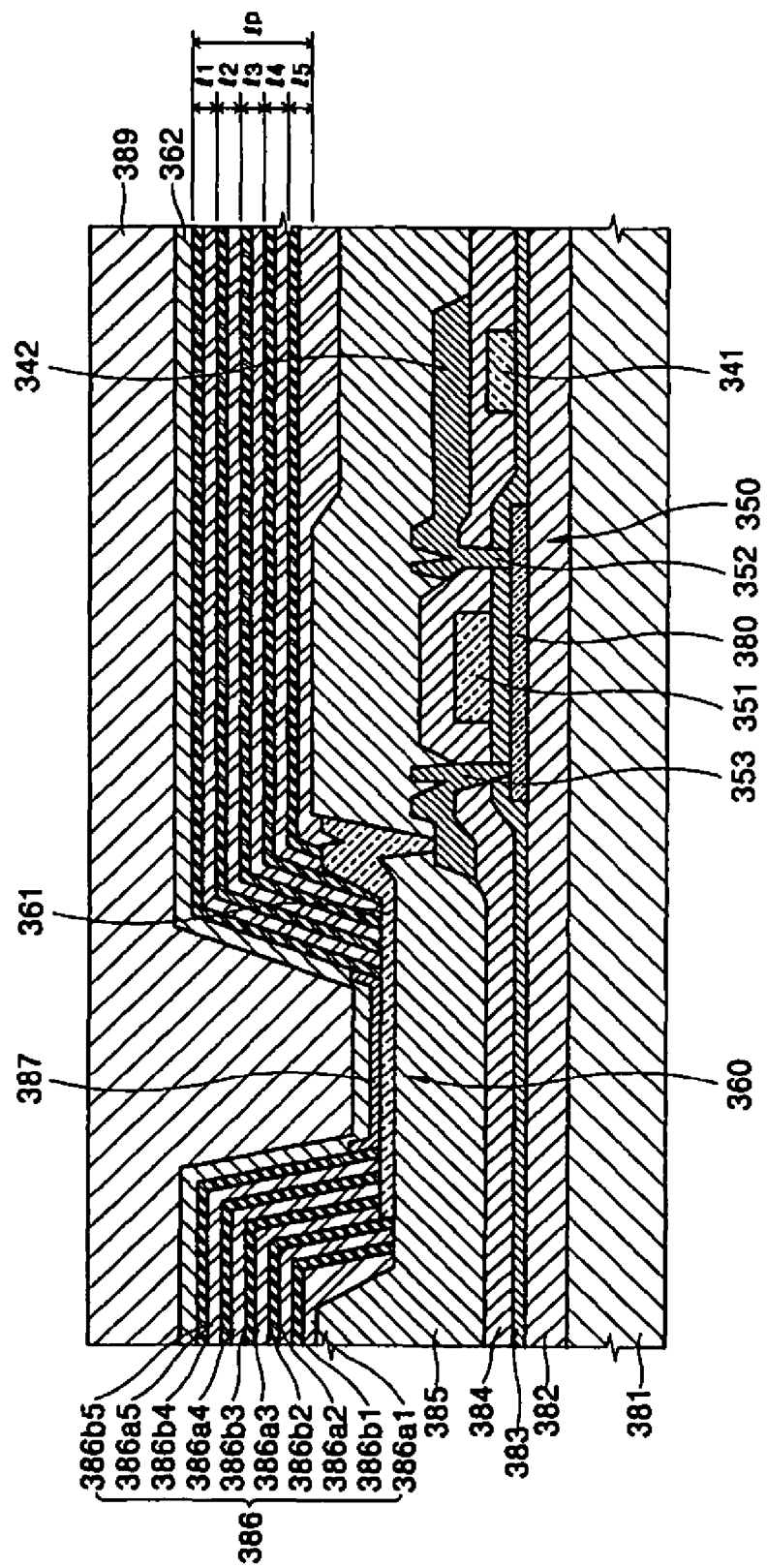
FIG. 9 is a cross-sectional view of an EL display device according to still further another exemplary embodiment of the present invention.

Referring to FIG. 9, which shows the EL display device as described with reference to FIG. 6, each of the sums 11, 12, 13, 14, and 15 of a distance between the barrier layers 386*b*1, 386*b*2, 386*b*3, 386*b*4, and 386*b*5 included in each pixel defining layer 386*a*1 386*a*2, 386*a*3, 386*a*4, and 386*a*5, respectively, and the thicknesses of the respective barrier layers 386*b*1, 386*b*2, 386*b*3, 386*b*4, and 386*b*5 may be about 1000 Å.

When each of the sums 11, 12, 13, 14, and 15 is far more than 1000 Å, the final thickness of the pixel defining layer 386 including the multiple barrier layer becomes too great, is thus complicating a subsequent process that will be described later. Therefore, each of the sums 11, 12, 13, 14, and 15 may be about 1000 Å. Also, when each of the sums 11, 12, 13, 14, and 15 is far less than 1000 Å, each of the barrier layers 386*b*1, 386*b*2, 386*b*3, 386*b*4, and 386*b*5 may be cut or deformed. As a result, it becomes difficult to prevent outgas generated in the pixel defining layer 386 from being discharged and affecting the display portion. Consequently, each of the sums 11, 12, 13, 14, and 15 may be about 1000 Å.

On the other hand, in the fabrication of an EL display device, after forming the foregoing pixel defining layer 386, a process of forming an organic layer including at least an EML between a pixel electrode and an opposing electrode is performed. In this process, when the organic layer is formed of a small molecule organic material, each layer may be formed using a vacuum evaporation method. However, if the organic layer is formed of a polymer organic material by a vacuum evaporation method using a mask, there are technical limits in minimizing a physical gap, it is difficult to apply the organic layer to an EL display device having several-tens-μm fine patterns due to the deformation of the mask, and the organic layer has technical limits in scaling-up.

In order to overcome these drawbacks, the organic layer may be coated using a spin coating process and finely patterned using a lithography process in which a photoresist layer is coated on the organic layer, exposed, and developed. However, in this case, since organic layers may be deformed by organic solvents and remnants of a developing solution, which are used in the lithography process, it is almost impossible to use the lithography process to pattern the organic layer.

Accordingly, in order to solve the above-described problems, a method of forming a display portion including an organic layer through an LITI process was developed.

In the LITI process, when a laser is used as an energy source that irradiates light onto a donor film, beams of the laser of which focus is controlled to a predetermined value are scanned onto the donor film according to desired patterns to coat an organic layer. Thus, the organic layer can be finely patterned through the focusing of the laser.

However, as described above, when a region where the organic layer will be formed and a transfer layer of the donor film are disposed opposite each other and laminated, if there is any protrusion on the surface of the region where the organic layer will be formed, the organic layer and the transfer layer cannot be precisely aligned to each other and the organic layer cannot be exactly transferred.

As described above, the process of forming the organic layer using the LITI process is performed after the pixel defining layer is formed. Therefore, as shown in FIG. 9, since the defining layer 386 protrudes over the display portion 360, the pixel defining layer 386 may be formed to a thickness of 5000 Å or less to solve the above-described problems.

When a conventional pixel defining layer, which is about 1.5 to 2 μm thick, is used, an organic layer cannot be desirably formed using the LITI process. Accordingly, the pixel defining layer 386 may be formed to a thickness $1_p$ of about 5000 Å or less.

In this case, considering that each of the sums 11, 12, 13, 14, and 15 of a distance between the barrier layers 386*b*1, 386*b*2, 386*b*3, 386*b*4, and 386*b*5 included in each pixel defining layer 386 and the thicknesses of the respective barrier layers 386*b*1, 386*b*2, 386*b*3, 386*b*4, and 386*b*5 is about 1000 Å as described above, the number of the barrier layers 386*b*1, 386*b*2, 386*b*3, 386*b*4, and 386*b*5 included in the pixel defining layer 386 may be 5 or fewer.

FIGS. 10, 11, and 13 through 15 are cross-sectional views for explaining a method of fabricating an EL display device according to an exemplary embodiment of the present invention. More specifically, a process of forming a pixel defining layer including a barrier layer will now be described.

Figure 10:
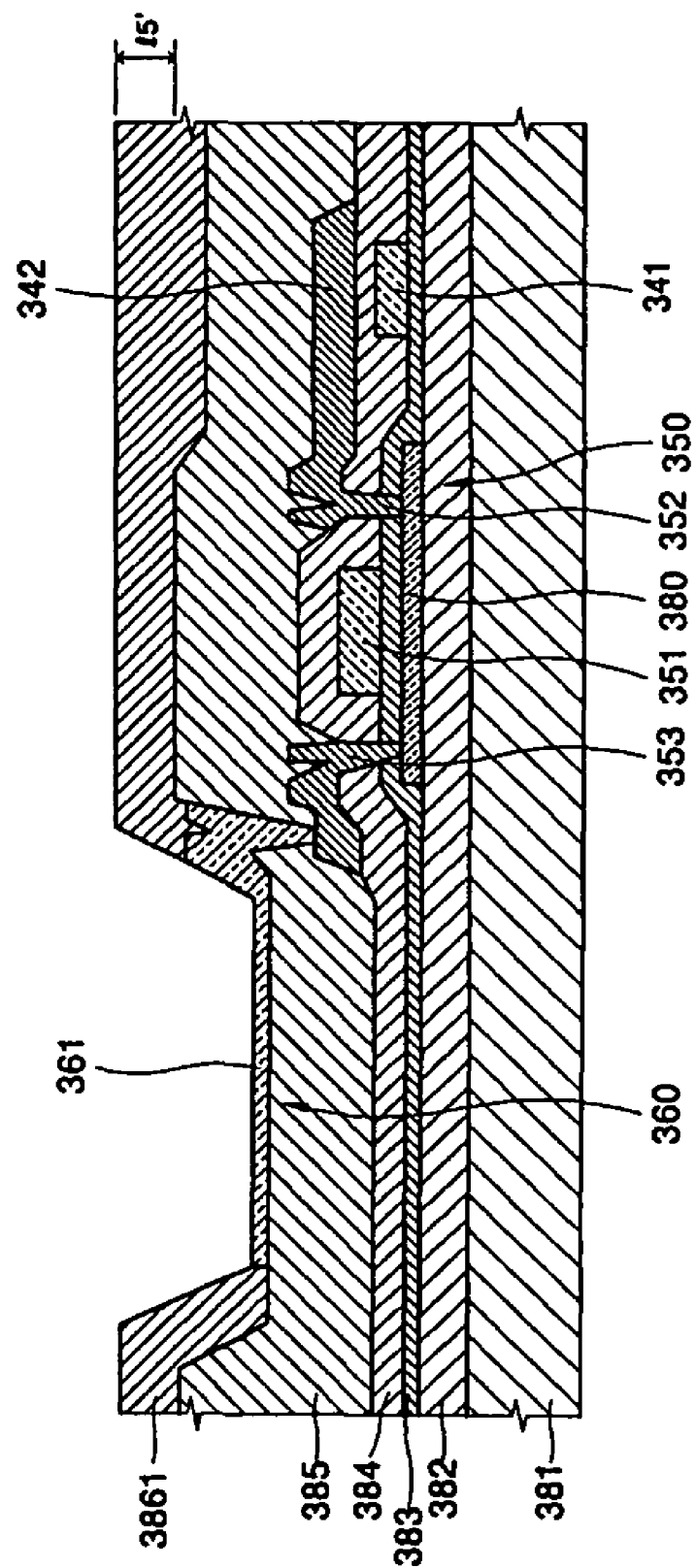
FIGS. 10, 11, and 13 through 15 are cross-sectional views for explaining a method of fabricating an EL display device according to an exemplary embodiment of the present invention.

Referring to FIG. 10, to fabricate the EL display device, a predetermined pattern of a pixel electrode 361 is formed on a substrate 381, and then a pixel defining layer 3861 is formed on the entire surface of the substrate 381 and patterned to expose a part of the pixel electrode 361. Of course, before forming the predetermined pattern of the pixel electrode 361 on the substrate 381, a TFT 350 and a storage capacitor may be formed on the substrate 381. Also, after forming an opposing electrode, a passivation layer or a front substrate may be formed.

Figure 11:
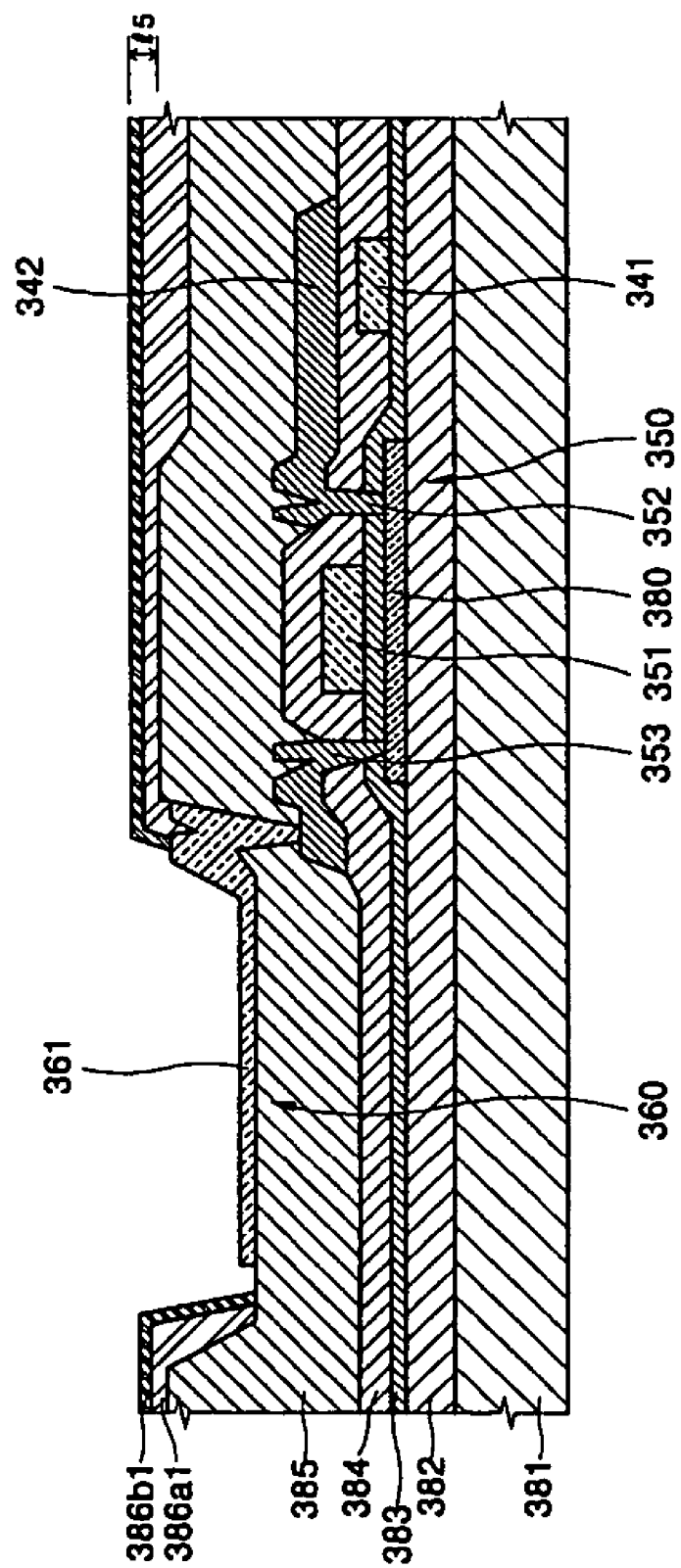

After patterning the pixel defining layer 3861, as shown in FIG. 11, a barrier layer 386*b*1 is formed on the pixel defining layer 3861, an organic layer including at least an EML is formed on the exposed part of the pixel electrode 361, and an opposing electrode is formed on the organic layer.

The pixel defining layer 3861 may be formed of, for example, one material selected from the group consisting of polystyrene, polymethylmethacrylate, polyacrylonitrile, polyamide, polyimide, polyarylether, heterocyclic polymer, parylene, fluorine polymer, epoxy resin, benzocyclobutene based resin, siloxane based resin, and silane resin.

The barrier layer 386*b*1 may be formed by hardening an upper part of the existing pixel defining layer 3861 pattern by injecting impurities X onto the pixel defining layer 3861.

The impurities X can be, for example, ions or inert gas.

The ions can be ions of one element selected from the group consisting of B, P and As. The ions may be injected onto the pixel defining layer 160 to a dose amount of about $10^{14}$ to $10^{15}$ ions/cm$^2$ at an acceleration energy of about 75 to about 85 keV using an ion injector, such as, for example, an ion shower or implantation process.

On the other hand, the inert gas can be a gas selected from the group consisting of Ar, He, Xe, H$_2$, and Ne. The inert gas may be accelerated onto the pixel defining layer 160 at a flow rate of at least 50 sccm (standard cubic centimeters per minute) at an electric power of about 100 W in a vacuum of about 10 to 400 mtorr using sputtering equipment, such as, for example, an etcher or asher.

The thicker the barrier layer 386*b*1 is formed, the more it is capable of preventing outgas from permeating into an organic emission layer. However, although the barrier layer may be formed thick using high energy or increasing the concentration of impurities, this may increase production cost, since expensive equipment may be required, or increase fabrication time, thereby lowering productivity.

Therefore, the thickness of the barrier layer 160' may be about 10% or less of the thickness of the pixel defining layer 3861.

Also, the barrier layer 386b1 may be formed on the pixel defining layer 3861, is naturally formed by heat curing the pixel defining layer 3861. In this case, the pixel defining layer 3861 may be heat cured by performing an annealing process in a vacuum oven or furnace, The barrier layer 386b1 on the pixel defining layer may be formed by heat curing the pixel defining layer until the pixel defining layer shrinks to about 50% of an original thickness of the pixel defining layer.

Figure 12:
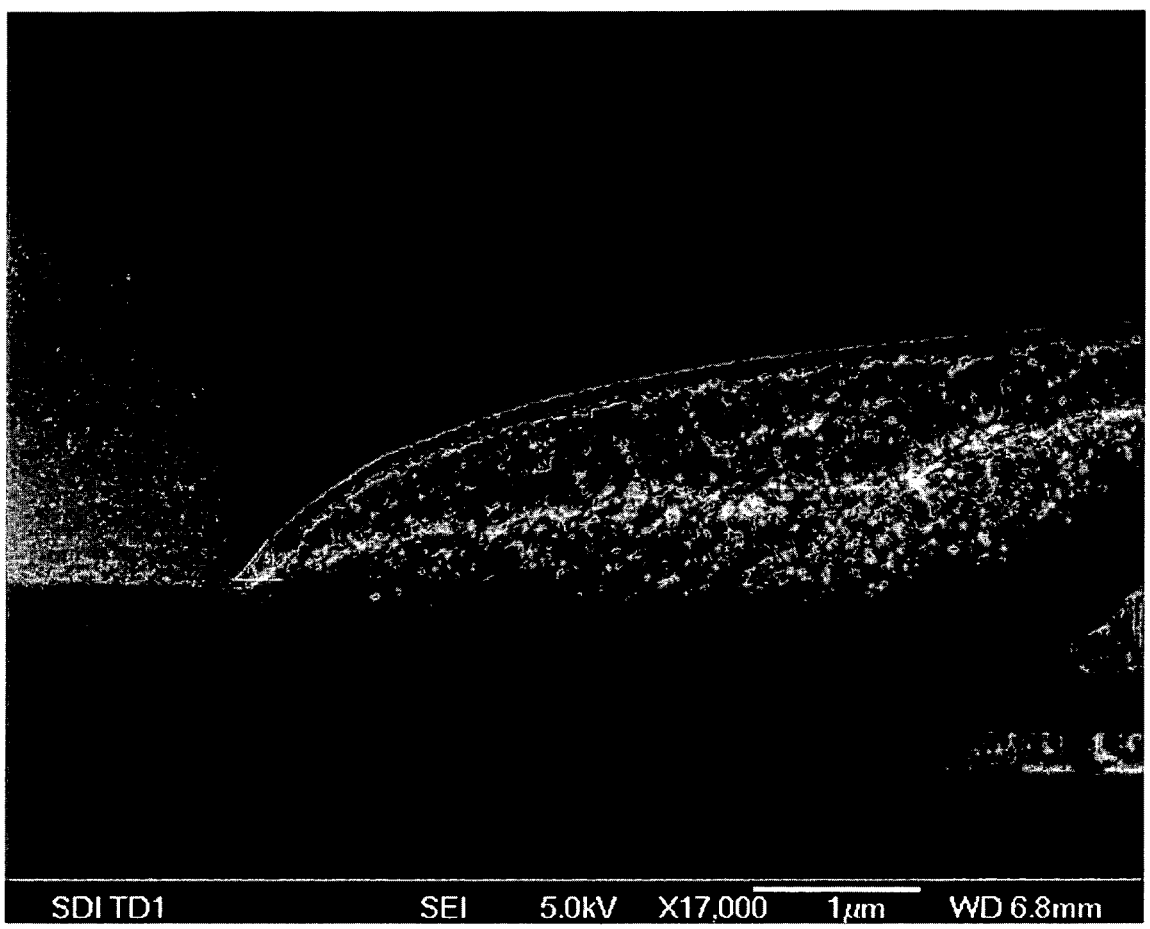
FIG. 12 is a photograph of a double barrier layer obtained after heat curing a material for a pixel defining layer.

FIG. 12 is a photograph of the pixel defining layer 3861 including a double barrier layer obtained after the above-described heat curing process. Referring to FIG. 12, a lower barrier layer is formed to a thickness of about 500 to 1000 Å, an upper barrier layer is formed to a thickness of about 1000 to 1500 Å, and the total thickness of the pixel defining layer 3861 is about 1.5 μm.

Figure 13:
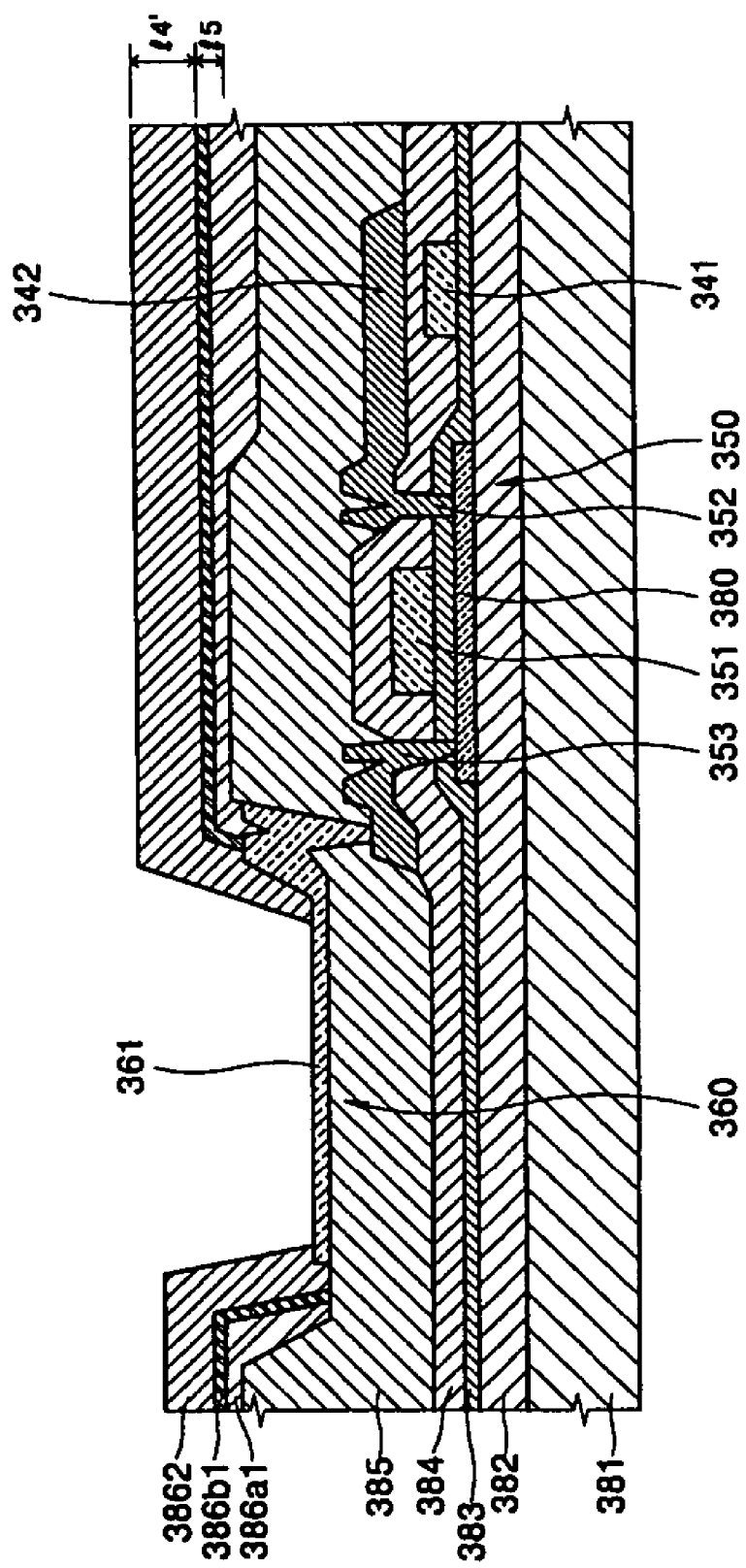
Figure 14:
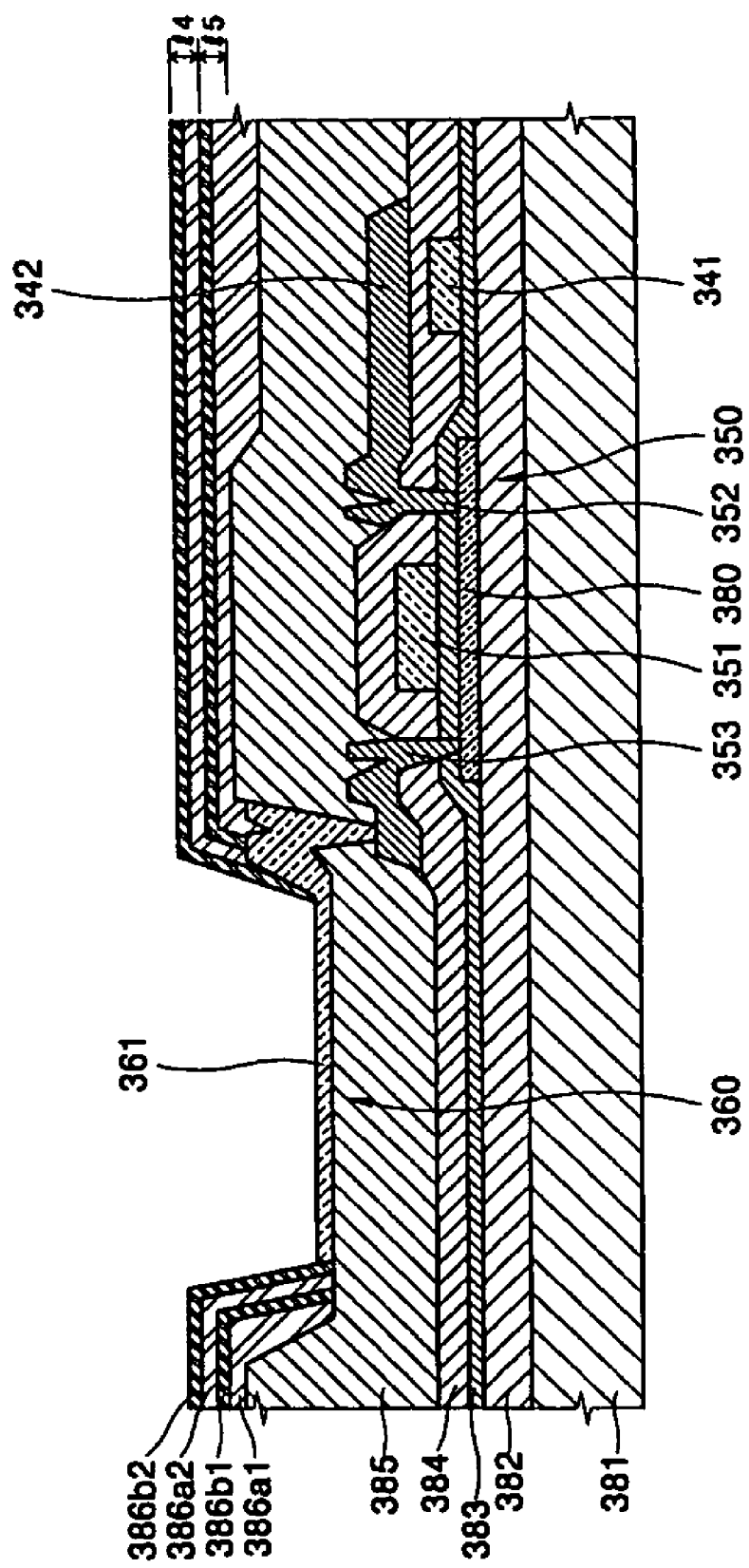

On the other hand, in order to form the pixel defining layer 3861 including a multiple barrier layer, the above-described process may further include a process of forming a pixel defining layer 3862 on the entire surface of the substrate 381 as shown in FIG. 13, a process of patterning the pixel defining layer 3862 to expose a part of the pixel electrode 361, and a process of forming a barrier layer 386b2 on the pixel defining layer 3862 as shown in FIG. 14 after forming the barrier layer 386b1 on the pixel defining layer 3861 and before forming emission layer on the exposed part of the pixel electrode 361. By performing the additional processes, a pixel defining layer including two barrier layers 386b1 and 386b2 may be formed as shown in FIG. 14.

Figure 15:
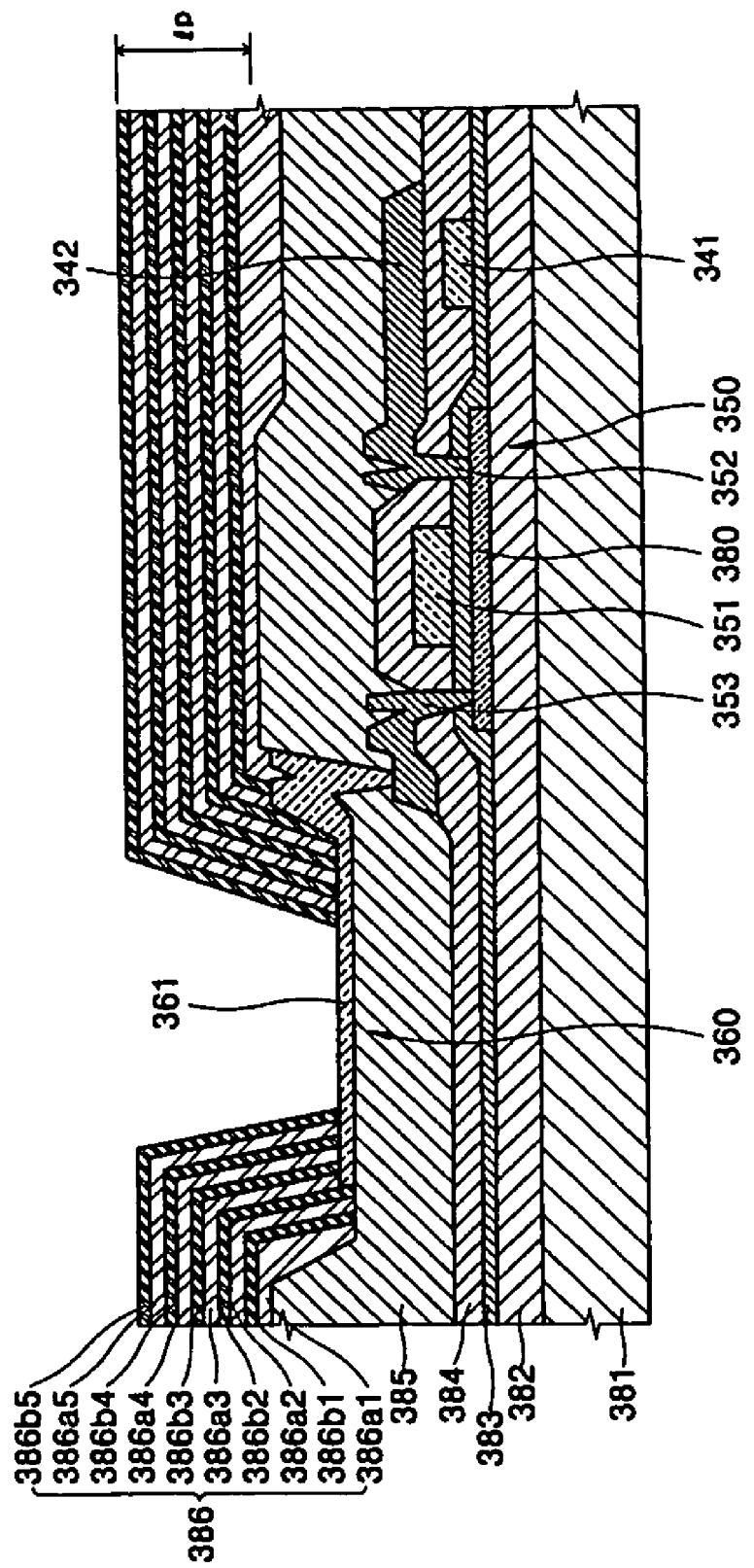

Furthermore, before forming the emission layer on the exposed part of the pixel electrode 361, the above-described additional processes may be repeated at least once, thus forming a plurality of barrier layers 386b1, 386b2, 386b3, 386b4, and 386b5 as shown in FIG. 15.

In the above-described processes, when the pixel defining layers 3861 and 3862 are coated on the entire surface of the substrate 381, they may be coated to thicknesses 15' and 14' of about 2000 Å, respectively. In more detail, since the barrier layers 386b1 and 386b2 are formed on the pixel defining layers 3861 and 3862 using the heat curing process (i.e., the annealing process) as described above, the pixel defining layers 3861 and 3862 are thinned out during the annealing process. Therefore, in order that each of the sums 15 and 14 of a distance between the barrier layers 386b1 and 386b2 and the respective barrier layers 386b1 and 386b2 may be about 1000 Å as described above, the pixel defining layers 3861 and 3862 may be coated to thicknesses 15' and 14' of about 2000 Å and then plasticized to about 1000 Å.

On the other hand, the pixel defining layer 386 as shown in FIG. 15 includes barrier layers 386b1, 386b2, 386b3, 386b4, and 386b5, which are parallel to one another. In order that the barrier layers 386b1, 386b2, 386b3, 386b4, and 386b5 may be parallel to one another, after forming the barrier layer 386b1 on the pixel defining layer 3861, the process of patterning the pixel defining layer 3862 to expose the part of the pixel electrode 361 is performed such that the patterned pixel defining layer 3862 covers the pixel defining layer 3861 including the barrier layer 386b1.

On the other hand, the edge portions of the barrier layers included in the pixel defining layer may be adjacent to one another as described above. The fabrication of such an EL display device will be described with reference to FIGS. 16 through 20, which are cross-sectional views for explaining a method of fabricating an EL display device according to another exemplary embodiment of the present invention.

Figure 16:
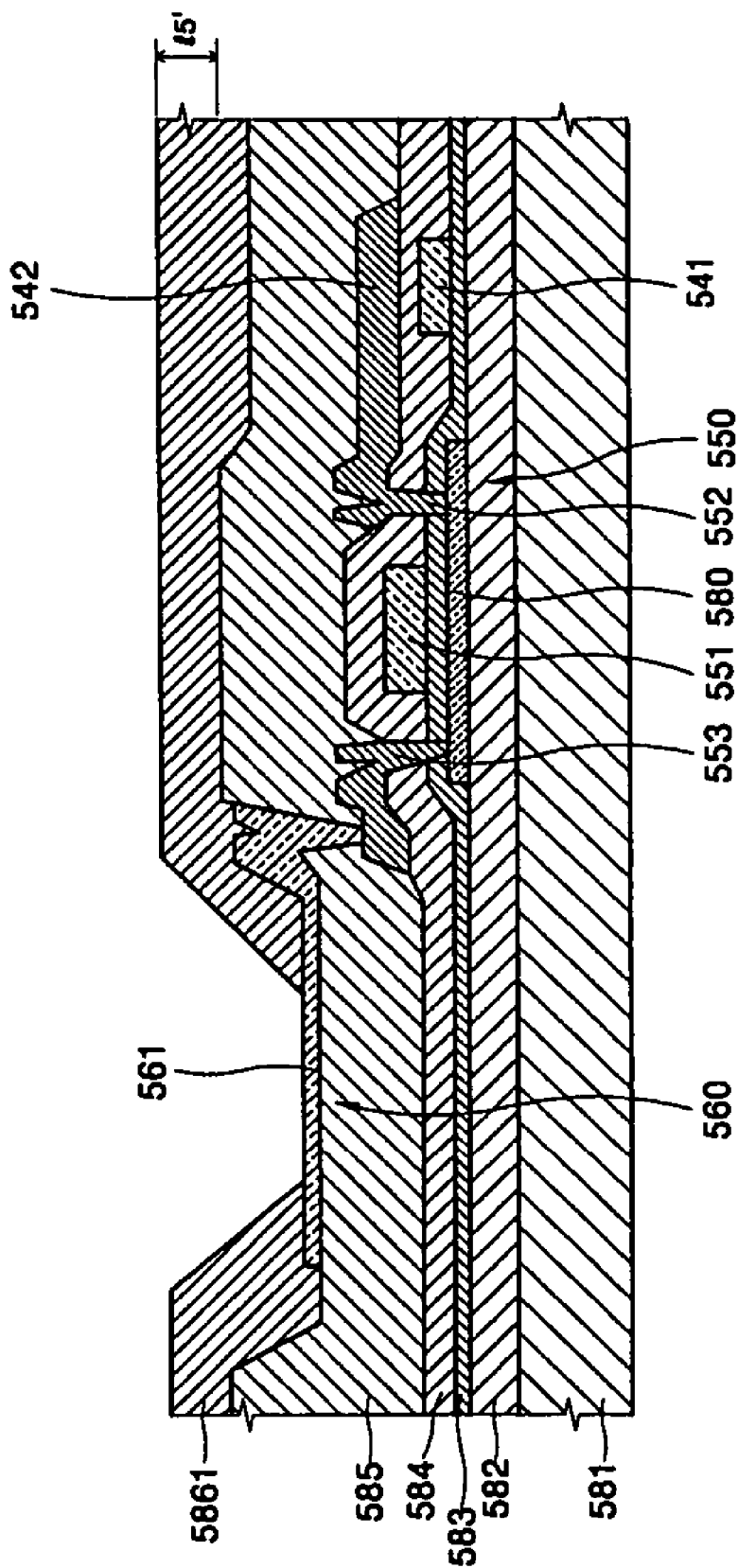
FIGS. 16 through 20 are cross-sectional views for explaining a method of fabricating an EL display device according to another exemplary embodiment of the present invention.
Figure 17:
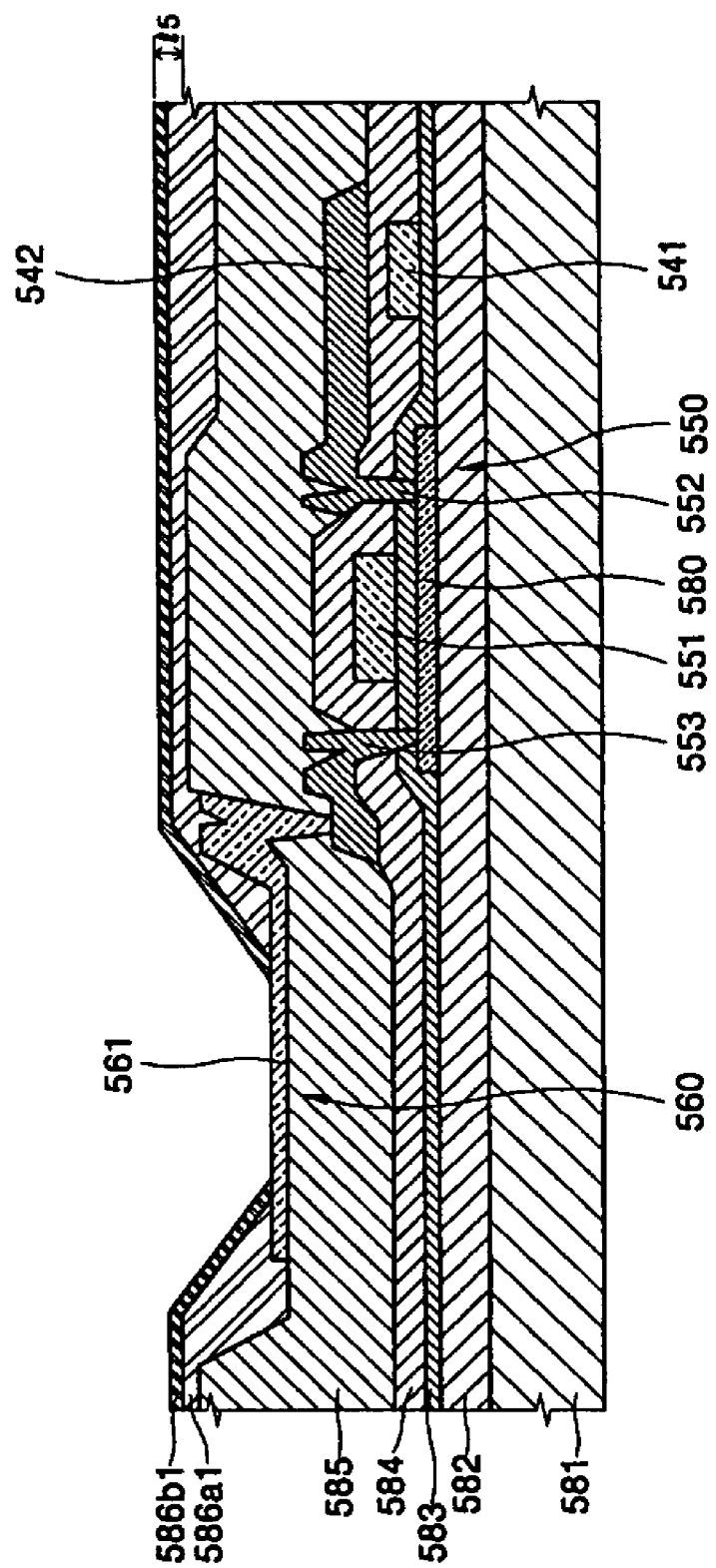

As shown in FIG. 16, a pixel defining layer 5861 is coated on the entire surface of a substrate 581 to a thickness 15' of about 2000 Å and patterned to expose a part of a pixel electrode 581. Subsequently, the pixel defining layer 5861 is plasticized, thereby forming a first barrier layer 586b1 on the surface of the pixel defining layer 5861 as shown in FIG. 17. In this case, as described above, the pixel defining layer 5861 is plasticized to a thickness of about 1000 Å.

Figure 18:
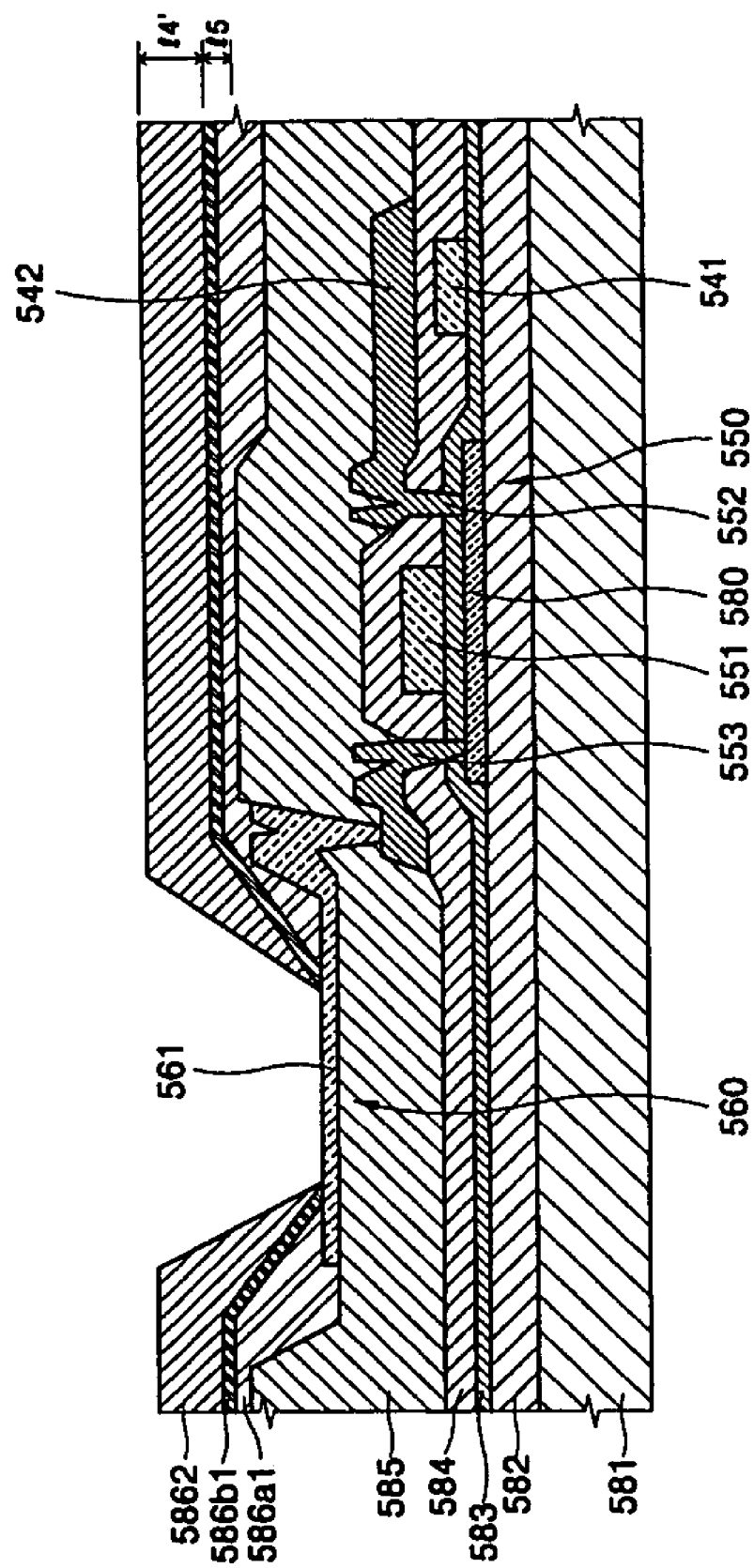
Figure 19:
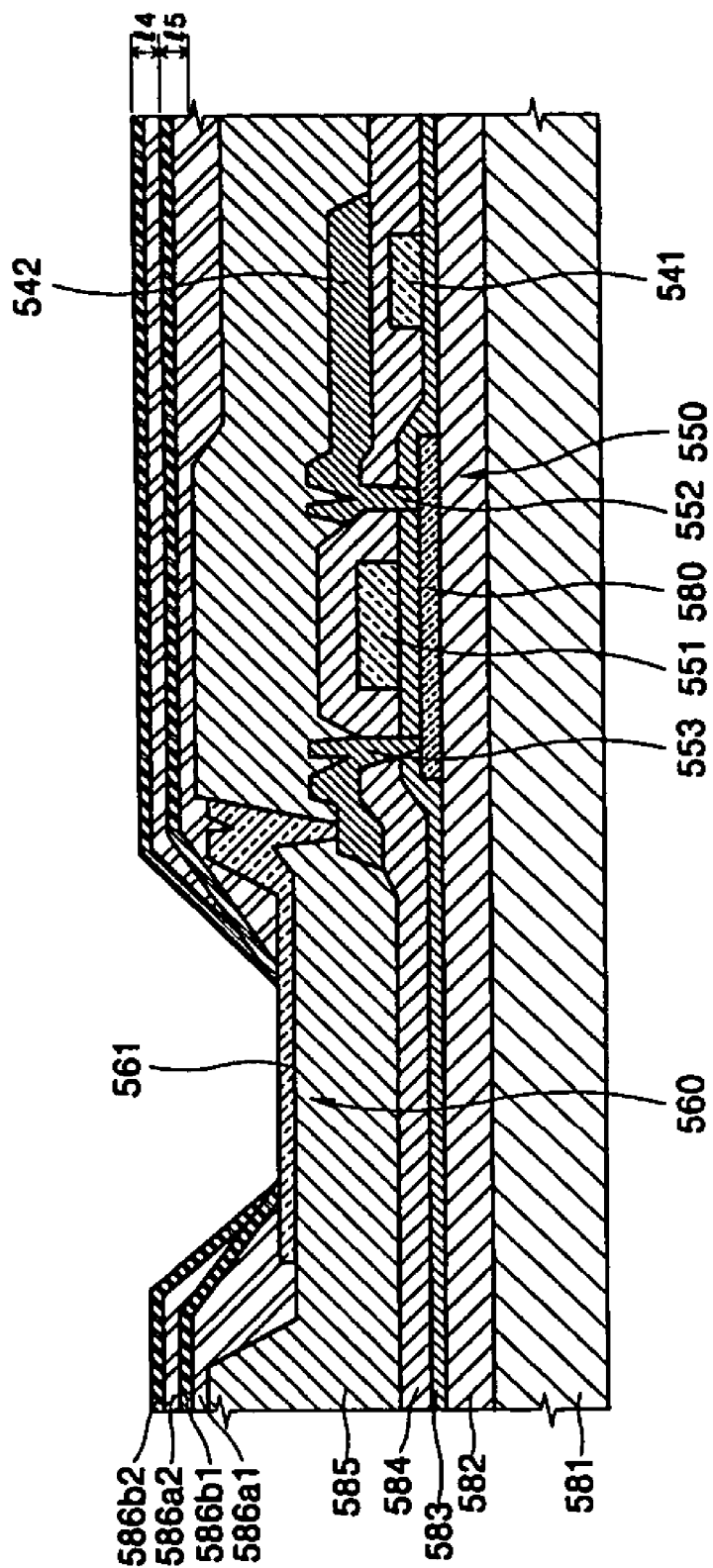
Figure 20:
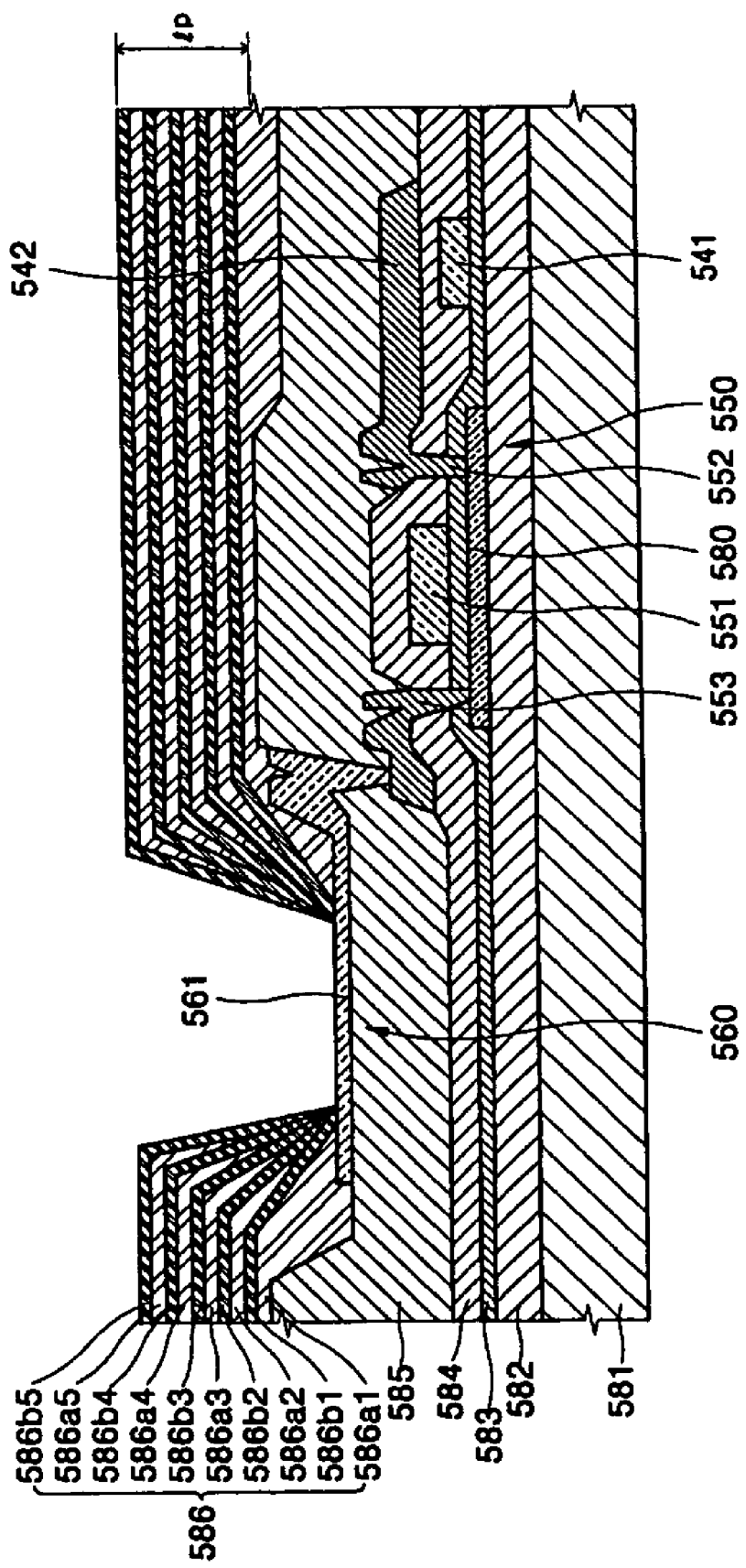

Thereafter, as shown in FIG. 18, a pixel defining layer 5862 is formed on the entire surface of the substrate 581 and patterned to expose a part of a pixel electrode 561. During the patterning process, an edge portion of the barrier layer 586b1 disposed on the pixel defining layer 5861 is exposed. Subsequently, the pixel defining layer 5862 is heat cured, thereby forming a second barrier layer 586b2 on an upper part of the pixel defining layer 5862. The above-described processes are repeated at least once, so that the a pixel defining layer 586 includes a plurality of barrier layers 586b1, 586b2, 586b3, 586b4, and 586b5 and edge portions of the barrier layers 586b1, 586b2, 586b3, 586b4, and 586b5 are adjacent to one another.

On the other hand, although it is explained that the exemplary embodiments are applied to an active matrix EL display device, the present invention can be also applied to any EL display device including a pixel defining layer, such as a passive matrix EL display device.

As described above, according to the EL display device and method of fabricating the same of the present invention, the following effects can be obtained.

First, a pixel defining layer includes at least one barrier layer to prevent generation of outgas, so that the amount of outgas from the pixel defining layer can be reduced.

Second, since the pixel defining layer includes at least one barrier layer, the discharge of outgas generated in the pixel defining layer is blocked. As a result, it is possible to prevent the outgas from affecting and degrading a display portion including an EML.

Third, a discharge path of outgas generated in the pixel defining layer is extended owing to the pixel defining layer including at least one barrier layer. Thus, the discharge amount of the outgas can be minimized.

Fourth, the pixel defining layer is formed to a thickness of about 5000 Å or less. Thus, after forming the pixel defining layer, the EML of the display portion can be formed using an LITI process.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:
1. An electroluminescent (EL) display device comprising:
a substrate;
a pixel electrode disposed on the substrate;
a first pixel defining layer disposed on the pixel electrode and having an opening part exposing a predetermined part of the pixel electrode;
a first barrier layer disposed on the first pixel defining layer;

a second pixel defining layer disposed on the first barrier layer and having an opening part exposing the predetermined part of the pixel electrode;
a second barrier layer disposed on the second pixel defining layer;
an emission layer disposed inside the opening part and contacting the pixel electrode and a part of the second barrier layer; and
an opposed electrode disposed directly on the emission layer and a remaining part of the second barrier layer inside the opening part,
wherein the pixel electrode contacts the first pixel defining layer, the first barrier layer, the second pixel defining layer, and the second barrier layer, and
wherein each of the pixel defining layers has a thickness of about 1000 to 5000 Å.

2. The device according to claim 1, wherein each of the barrier layers has a thickness of about 10% or less of the thickness of the pixel defining layer.

3. The device according to claim 1, wherein the barrier layer is a cured portion of the pixel defining layer.

4. The device according to claim 1, further comprising an emission layer on the pixel electrode, the emission layer being directly on the barrier layer.

5. The device according to claim 1, wherein the barrier layer is an impurity doped organic layer.

6. The device according to claim 5, wherein the impurity is one selected from the group consisting of B, P, As, Ar, He, Xe, $H_2$ and Ne.

7. An electro luminescent (EL) display device comprising:
a substrate;
a pixel electrode disposed on the substrate;
a plurality of pixel defining layers disposed on the pixel electrode, each of the pixel defining layers having an opening part exposing a part of the pixel electrode; and
a barrier layer disposed on each of the pixel defining layers;
an emission layer disposed inside the opening part and contacting the pixel electrode and a part of an uppermost barrier layer; and
an opposed electrode disposed directly on the emission layer and a remaining part of the uppermost barrier layer inside the opening part,
wherein each of the pixel defining layers has a thickness of about 1000 to 5000 Å.

8. The device according to claim 7, wherein each of the barrier layers has a thickness of about 10% or less of the thickness of each of the pixel defining layers.

9. The device according to claim 7, wherein the barrier layers are formed by curing an upper part of each of the pixel defining layers by injecting ions or inert gas onto the pixel defining layers.

10. The device according to claim 9, wherein the ions are ions of one element selected from a group consisting of B, P and As.

11. The device according to claim 9, wherein the inert gas is one selected from a group consisting of Ar, He, Xe, $H_2$, and Ne.

12. The device according to claim 7, wherein edge portions of the barrier layers disposed on each of the pixel defining layers contact each other.

13. The device according to claim 7, wherein the barrier layers are a cured portion of the pixel defining layer.

14. The device according to claim 7, further comprising an emission layer on the pixel electrode, the emission layer being directly on the barrier layer.

15. The device according to claim 7, wherein the barrier layer is an impurity doped organic layer.

16. The device according to claim 15, wherein the impurity is one selected from the group consisting of B, P, As, Ar, He, Xe, $H_2$ and Ne.

* * * * *

UNITED STATES PATENT AND TRADEMARK OFFICE
CERTIFICATE OF CORRECTION

| | | |
|---|---|---|
| PATENT NO. | : 8,278,818 B2 | Page 1 of 1 |
| APPLICATION NO. | : 11/143952 | |
| DATED | : October 2, 2012 | |
| INVENTOR(S) | : Jeong et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1037 days.

Signed and Sealed this
Twenty-third Day of September, 2014

Michelle K. Lee
*Deputy Director of the United States Patent and Trademark Office*